United States Patent
Willson et al.

(10) Patent No.: US 10,139,724 B2
(45) Date of Patent: Nov. 27, 2018

(54) ANHYDRIDE COPOLYMER TOP COATS FOR ORIENTATION CONTROL OF THIN FILM BLOCK COPOLYMERS

(71) Applicant: Board of Regents The University of Texas System, Austin, TX (US)

(72) Inventors: C. Grant Willson, Austin, TX (US); Christopher John Ellison, Austin, TX (US); Takehiro Sleshimo, Austin, TX (US); Julia Cushen, Austin, TX (US); Christopher M. Bates, Austin, TX (US); Leon Dean, Spokane, WA (US); Logan J. Santos, Austin, TX (US); Erica L. Rausch, Austin, TX (US)

(73) Assignee: Board of Regents The University of Texas System, Austin, TX (US)

( * ) Notice: Subject to any disclaimer, the term of this patent is extended or adjusted under 35 U.S.C. 154(b) by 289 days.

(21) Appl. No.: 14/839,147

(22) Filed: Aug. 28, 2015

(65) Prior Publication Data
US 2015/0370159 A1   Dec. 24, 2015

Related U.S. Application Data

(62) Division of application No. 13/761,918, filed on Feb. 7, 2013, now Pat. No. 9,157,008.
(Continued)

(51) Int. Cl.
*G03F 1/50* (2012.01)
*B05D 1/00* (2006.01)
(Continued)

(52) U.S. Cl.
CPC ............ *G03F 1/50* (2013.01); *B05D 1/005* (2013.01); *B05D 5/00* (2013.01); *B05D 7/52* (2013.01);
(Continued)

(58) Field of Classification Search
CPC ..... Y10T 428/24802; Y10T 428/31663; Y10T 428/31931; C09D 153/00
See application file for complete search history.

(56) References Cited

U.S. PATENT DOCUMENTS 4,278,510 A * 7/1981 Chien ............... C08K 3/04 205/158
7,521,090 B1 4/2009 Cheng et al. ........... 427/256
(Continued)

FOREIGN PATENT DOCUMENTS

CN 101734610 A 6/2010
WO WO/2011/116223 9/2011
(Continued)

OTHER PUBLICATIONS

Bates, C. M. et al. (2011) "Polymeric Cross-Linked Surface Treatments for Controlling Block Copolymer Orientation in Thin Films," *Langmuir* 27(5), 2000-2006.
(Continued)

*Primary Examiner* — Betelhem Shewareged
(74) *Attorney, Agent, or Firm* — Medlen and Carroll, LLP

(57) ABSTRACT

The concepts described herein involve the use of random copolymer top coats that can be spin coated onto block copolymer thin films and used to control the interfacial energy of the top coat-block copolymer interface. The top coats are soluble in aqueous weak base and can change surface energy once they are deposited onto the block copolymer thin film. The use of self-assembled block copolymers to produce advanced lithographic patterns relies on their orientation control in thin films. Top coats potentially allow for the facile orientation control of block copolymers which would otherwise be quite challenging.

10 Claims, 20 Drawing Sheets

Related U.S. Application Data

(60) Provisional application No. 61/597,327, filed on Feb. 10, 2012.

(51) Int. Cl.

| | | |
|---|---|---|
| *B05D 5/00* | (2006.01) | |
| *B05D 7/00* | (2006.01) | |
| *B81C 1/00* | (2006.01) | |
| *G03F 7/00* | (2006.01) | |
| *C09D 137/00* | (2006.01) | |
| *B82Y 10/00* | (2011.01) | |
| *B82Y 40/00* | (2011.01) | |
| *C09D 167/00* | (2006.01) | |

(52) U.S. Cl.
CPC ............ *B05D 7/56* (2013.01); *B81C 1/00031* (2013.01); *B82Y 10/00* (2013.01); *B82Y 40/00* (2013.01); *C09D 137/00* (2013.01); *C09D 167/00* (2013.01); *G03F 7/0002* (2013.01); *B05D 2252/02* (2013.01); *B81C 2201/0149* (2013.01); *Y10T 428/24802* (2015.01); *Y10T 428/31663* (2015.04); *Y10T 428/31855* (2015.04)

(56) References Cited

U.S. PATENT DOCUMENTS

| | | | | |
|---|---|---|---|---|
| 2008/0113283 | A1* | 5/2008 | Ghoshal | B82Y 10/00 430/22 |
| 2009/0181171 | A1 | 7/2009 | Cheng et al. | 427/240 |
| 2010/0316849 | A1 | 12/2010 | Millward et al. | 428/195.1 |
| 2011/0147984 | A1 | 6/2011 | Cheng et al. | 427/259 |
| 2011/0186544 | A1 | 8/2011 | Endou et al. | 216/58 |
| 2012/0296033 | A1* | 11/2012 | Gleason | C09D 139/00 524/549 |
| 2013/0052769 | A1* | 2/2013 | Luch | H01L 31/0508 438/66 |
| 2013/0344242 | A1 | 12/2013 | Willson et al. | 427/216 |

FOREIGN PATENT DOCUMENTS

| | | | | |
|---|---|---|---|---|
| WO | WO-2011116223 | A1 * | 9/2011 | ........... G03F 7/0758 |
| WO | WO/2012/175343 | | 12/2012 | |

OTHER PUBLICATIONS

Bates, F. S. et al. (1990) "Block copolymer theiodynamics: theory and experiment," *Annual Review of Physical Chemistry* 41, 525-557.

Colburn, M. et al. (2000) "Step and flash imprint lithography for sub-100-nm patterning," *Proceedings of SPIE—The International Society for Optical Engineering 3997*, 453-457.

Gillham, J. K. (1986) "Formation and Properties of Thermosetting and High $T_g$ Polymeric Materials," *Polymer Engineering and Science* 26(20), 1429-1433.

Han, E. et al. (2009) "Perpendicular Orientation of Domains in Cylinder-Forming Block Copolymer Thick Films by Controlled Interfacial Interactions," *Macromolecules* 42(13), 4896-4901.

Kim, H.-C. et al. (2001) "A Route to Nanoscopic $SiO_2$ Posts via Block Copolymer Templates," *Advanced Materials* 13(11), 795-797.

Kim, H.-C. et al. (2009) "Block Copolymer Based Nanostructures: Materials, Processes, and Applications to Electronics," *Chemical Reviews* 110(1), 146-177.

Lammertink, R. G. H. et al. (2000) "Nanostructured Thin Films of Organic-Organometallic Block Copolymers: One-Step Lithography with Poly(ferrocenylsilanes) by Reactive Ion Etching," *Advanced Materials* 12(2), 98-103.

Li, M. et al. (2006) "Block copolymer patterns and templates," *Materials Today* 9(9), 30-39.

Milner, S. T. (1991) "Polymer brushes," *Science* 251(4996), 905-914.

Nagarajan, S. et al. (2008) "An Efficient Route to Mesoporous Silica Films with Perpendicular Nanochannels," *Advanced Materials* 20(2), 246-251.

Niu, S. et al. (2003) "Stability of Order in Solvent-Annealed Block Copolymer Thin Films," *Macromolecules* 36(7), 2428-2440.

Ross, C. A. (2001) "Patterned Magnetic Recording Media," *Annual Review of Materials Research* 31(1), 203-238.

Ruiz, R. et al. (2008) "Density multiplication and improved lithography by directed block copolymer assembly," *Science* 321(5891), 936-939.

Walton, D. G. et al. (1994) "A Free Energy Model for Confined Diblock Copolymers," *Macromolecules* 27(21), 6225-6228.

Zhao, B. et al. (2000) "Polymer brushes: surface-immobilized macromolecules," *Progress in Polymer Science* 25(5), 677-710.

PCT International Search Report of International Application No. PCT/US2013/025174 dated Jun. 6, 2013.

* cited by examiner

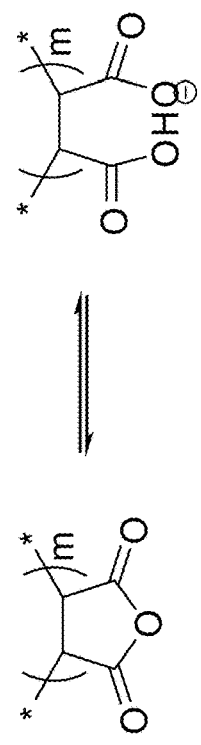

FIGURE 5

Water contact angle and surface energy change as a function of annealing a thin film, because ring opens and closes.

Longer annealing times correspond to the ring closed form (higher contact angle because it's less polar, dislikes water)

Ring opened anionic form is aqueous weak base soluble, ring closes to lower the surface energy once it is applied to the thin film and annealed.

m:n:l = 43 : 32 : 25 mol%

Experimental Procedure (Cont.)

8) Anneal the thin films at 170 °C for 18 hours.

9) Strip the top coat by spinning the wafer at 3000 rpm and applying 10 drops of 30 wt% NH4OH aqueous solution dropwise.

10) Oxygen plasma etch the block copolymer with the following conditions:
Pressure=20 mTorr, RF Power=10 W, ICP Power=50 W, O2 flow rate=75 sccm, Argon flowrate=75 sccm, temperature=15 °C, time=45 sec.

SCANNING ELECTRON MICROSCOPE

BCP Thickness before anneal: 65.6 nm

After stripping the top coat: 66.9 nm

Film has been etched with $O_2$ plasma

Demonstrates perpendicular lamellar features

170 °C
TS 1-15 Top Coat
TMSSty – 34 nm (~ 1L$_0$)

CB 2-154-170C-3a-2

FIGURE 17
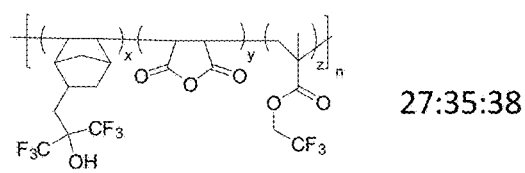
27:35:38
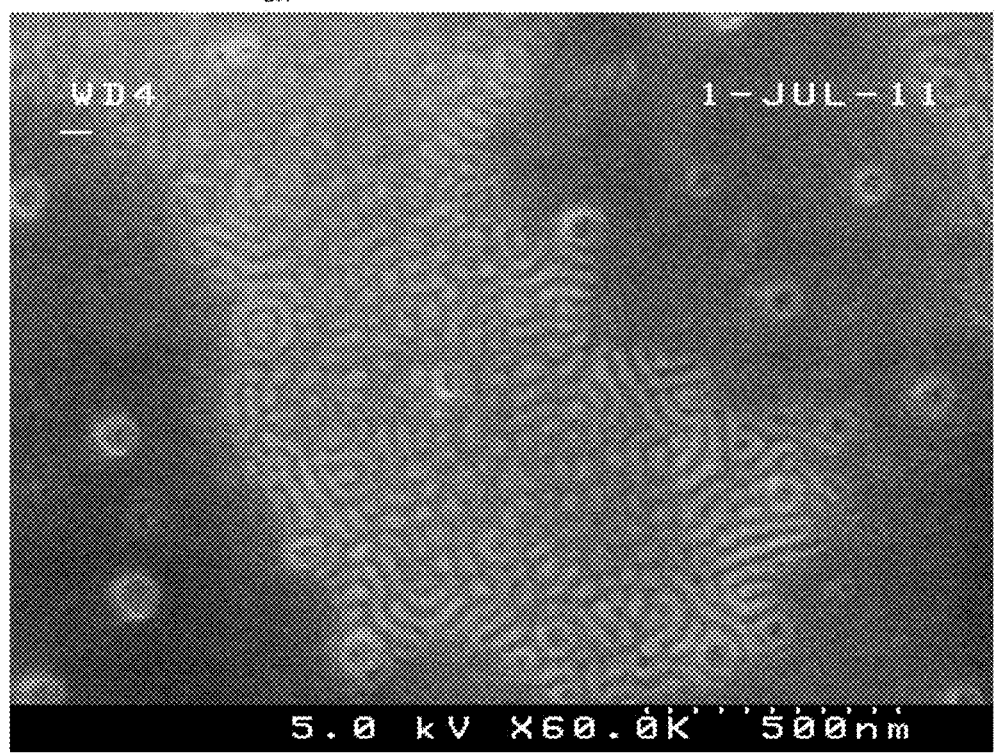
170 °C
Block thickness = 29.4 nm (1 $L_0$)
LD 1-74-4
Etched 1-2

FIGURE 18
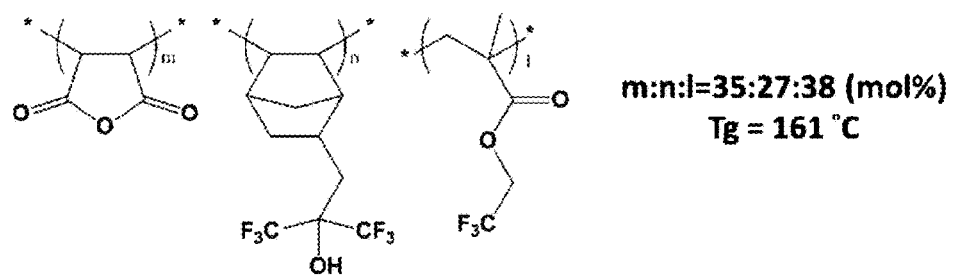
m:n:l=35:27:38 (mol%)
Tg = 161 °C
⊥ Lamellae!

FIGURE 20
Alternative Procedure (Cont.)
7) Anneal the thin films at 170 °C for 18 hours.
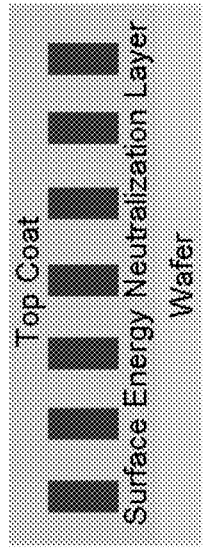
8) Strip the top coat by spinning the wafer at 3000 rpm and applying 10 drops of 30 wt% NH4OH aqueous solution dropwise.
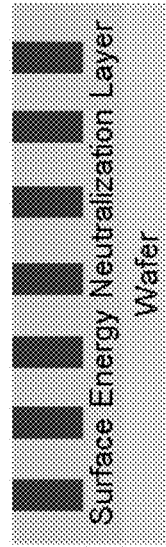
9) Oxygen plasma etch the block copolymer with the following conditions: Pressure=20 mTorr, RF Power=10 W, ICP Power=50 W, O2 flow rate=75 sccm, Argon flowrate=75 sccm, temperature=15 °C, time=45 sec.
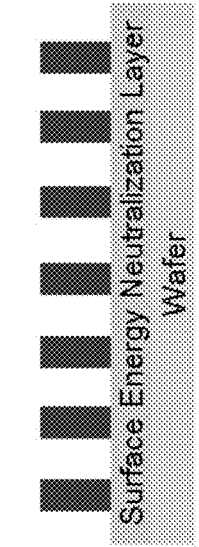

ANHYDRIDE COPOLYMER TOP COATS FOR ORIENTATION CONTROL OF THIN FILM BLOCK COPOLYMERS

This application claims the benefit of priority to Provisional Application U.S. Ser. No. 61/597,327, which was filed on Feb. 10, 2012, the disclosures of which are incorporated herein by reference.

FIELD OF THE INVENTION

The present invention involves the use of copolymer top coats that can be spin coated onto block copolymer thin films and used to control the interfacial energy of the top coat-block copolymer interface. The top coats are soluble in aqueous weak base and can change surface energy once they are deposited onto the block copolymer thin film. The use of self-assembled block copolymers to produce advanced lithographic patterns relies on their orientation control in thin films. Top coats potentially allow for the facile orientation control of block copolymers which would otherwise be quite challenging.

BACKGROUND OF THE INVENTION

The improvement in areal density in hard disk drives using conventional multigrain media is currently bound by the superparamagnetic limit [1]. Bit patterned media can circumvent this limitation by creating isolated magnetic islands separated by a nonmagnetic material. Nanoimprint lithography is an attractive solution for producing bit patterned media if a template can be created with sub-25 nm features [2]. Resolution limits in optical lithography and the prohibitive cost of electron beam lithography due to slow throughput [3] necessitate a new template patterning process. The self-assembly of diblock copolymers into well-defined structures [4] on the order of 5-100 nm produces features on the length scale required for production of bit patterned media. This is most efficiently accomplished by using block copolymers to produce templates for imprint lithography [5]. With the availability of the proper template, imprint lithography can be employed to produce bit-patterned media efficiently. Previous research has targeted block copolymers that produce hexagonally packed cylindrical morphology with selective silicon incorporation into one block for etch resistance [6] through post-polymerization $SiO_2$ growth [7], silica deposition using supercritical $CO_2$ [8], and silicon-containing ferrocenyl monomers [9]. What is needed is a method to create an imprint template with sub-100 nm features with the desired structural alignment of nanostructures that can be etched with the good oxygen etch contrast that silicon provides.

SUMMARY OF THE INVENTION

In one embodiment, the invention relates to a method of applying a top coat to a block copolymer film to create a layered structure, comprising: a) providing a surface, a surface energy neutralization layer copolymer, a block copolymer, and a top coat composition comprising maleic anhydride; b) treating said surface with said surface energy neutralization layer copolymer under conditions such that a first layer on said surface is created, said layer comprising a crosslinked polymer; c) coating said first layer with block copolymer under conditions such that a second layer on said surface is created comprising a block copolymer film; and d) coating said second layer with said top coat composition so as to create a third layer on said surface, said third layer comprising a top coat on said block copolymer film surface, said first, second and third layers comprising a layered structure. In one embodiment, said top coat composition is dissolved in an aqueous weak base prior to step d) to create a casting solvent. In one embodiment, said base is aqueous ammonium hydroxide and wherein the maleic anhydride opens and forms the ammonium salt of the corresponding maleic acid. In one embodiment, said surface energy neutralization layer composition is dissolved in an aqueous weak base prior to step b) to create a casting solvent. In one embodiment, said base is aqueous ammonium hydroxide and wherein the maleic anhydride opens and forms the ammonium salt of the corresponding maleic acid. In one embodiment, said block-co-polymer is not soluble in the casting solvent. In one embodiment, the invention further comprises: e) treating said layered structure under conditions such that nanostructures form. In one embodiment, said treating comprises annealing. In one embodiment, said annealing comprises heating. In one embodiment, the method further comprises: f) etching said layered structure under conditions such that the top coat and part of the block copolymer is removed revealing said nanostructures. In one embodiment, said etching comprises oxygen etching. In one embodiment, said surface is on a silicon wafer. In one embodiment, the invention relates to the nanostructures made according to the process described above. In one embodiment, said surface energy neutralization layer polymer is composed of a plurality of polymer components one of which is maleic anhydride. In one embodiment, said surface energy neutralization layer polymer components are soluble in aqueous weak base. In one embodiment, the proportions of the components can be varied such that the surface energy of the surface energy neutralization layer polymer layer is varied. In one embodiment, the surface energy of the surface energy neutralization layer polymer layer switches as the surface energy neutralization layer polymer is baked. In one embodiment, said treating of step (b) comprises: i) dissolving said surface energy neutralization layer polymer in a solvent; ii) spin coating the surface energy neutralization layer upon the surface; iii) crosslinking by exposure to 250° C. for 5 minutes; and iv) subsequently washing with solvent. In one embodiment, said solvent is toluene. In one embodiment, said nanostructures comprise cylindrical structures, said cylindrical structures being substantially vertically aligned with respect to the plane of the surface.

In one embodiment, the invention relates to a layered structure comprising first, second and third layers on a surface, wherein said first layer comprises a crosslinked polymer, wherein said second layer comprises a block copolymer film, and wherein said third layer comprises maleic anhydride. In one embodiment, said surface comprises silicon.

In one embodiment, the invention relates to a layered structure comprising first, second and third layers on a surface, wherein said first layer comprises a maleic anhydride based substrate neutralization layer, wherein said second layer comprises a block copolymer film, and wherein said third layer comprises maleic anhydride. In one embodiment, said surface comprises silicon.

In one embodiment, the invention relates to a method to achieve block copolymer domain orientation by: a) coating block copolymer film on a substrate, b) applying a top coat on top of the block copolymer by spin coating a polymer maleic anhydride based composition dissolved in an aqueous weak base, and c) annealing. In one embodiment, said annealing is by exposure to solvent vapors. In one embodiment, said annealing is by heating. In one embodiment, said substrate comprises silicon. In one embodiment, said substrate is a silicon wafer. In one embodiment, said substrate is quartz. In one embodiment, said substrate is glass. In one embodiment, said substrate is plastic. In one embodiment, said substrate is a transparent substrate. In one embodiment, said substrate is a roll-to-roll substrate. In one embodiment, said substrate is coated with a substrate surface energy neutralizing layer with surface energy in between that of two blocks. In one embodiment, said substrate surface energy neutralizing layer is selected from the group consisting of: (a) high Tg polymer, (b) a cross-linked polymer, (c) vapor deposited polymer such as parylene, (d) small molecule derivatives of silylating agents, and (e) polymer brush by end-attaching polymer to substrate. In one embodiment, said block copolymer contains on block with at least 10% by weight silicon. In one embodiment, said topcoat comprises at least maleic anhydride. In one embodiment, the invention further comprises: d) treating said layered structure under conditions such that nanostructures form. In one embodiment, said treating comprises annealing. In one embodiment, said annealing comprises heating. In one embodiment, the invention further comprises: e) etching said layered structure under conditions such that the topcoat and part of the block copolymer is removed revealing said nanostructures. In one embodiment, said block copolymers form nanostructured materials that can be used as etch masks in lithographic patterning processes. In one embodiment, a third monomer is provided and said block copolymer is a triblock copolymer. In one embodiment, the invention is related to the etched nanostructures made according to the process described above. In one embodiment, said etching comprises oxygen etching. In one embodiment, said nanostructures are selected from the group consisting of: lamellae, cylinders, vertically aligned cylinders, horizontally alligned cylinders, spheres, gyroids, network structures, and hierarchical nanostructures. In one embodiment, said nanostructures comprise cylindrical structures, said cylindrical structures being substantially vertically aligned with respect to the plane of the surface. In one embodiment, the proportions of the components can be varied such that the surface energy of the layer is varied. In one embodiment, the surface energy switches as the treatment composition is thermally annealed. In one embodiment, applying the surface energy neutralizing layer comprises: dissolving said surface energy neutralizing layer polymer in a solvent; spin coating the surface energy neutralizing layer polymer upon the surface; cross-linking by exposure to 250° C. for 5 minutes; and subsequently washing with solvent. In one embodiment, said solvent is toluene.

In one embodiment, the invention relates to a method of applying a top coat to a block copolymer film to create a layered structure, comprising: a) providing a surface, a surface energy neutralization layer polymer, a block copolymer, and a top coat composition comprising maleic anhydride; b) treating said surface with said surface energy neutralization layer polymer under conditions such that a first layer on said surface is created, said layer comprising a crosslinked polymer; c) coating said first layer with block copolymer under conditions such that a second layer on said surface is created comprising a block copolymer film; and d) coating said second layer with said top coat composition so as to create a third layer on said surface, said third layer comprising a top coat on said block copolymer film surface, said first, second and third layers comprising a layered structure. In one embodiment, said top coat composition is dissolved in an aqueous weak base prior to step d) to create a casting solvent. In one embodiment, said weak base is aqueous ammonium hydroxide and wherein the maleic anhydride opens and forms the ammonium salt of the corresponding maleic acid. In one embodiment, said block-co-polymer is not soluble in the casting solvent. In one embodiment, the method further comprises e) treating said layered structure under conditions such that nanostructures form. In one embodiment, the method further comprises e) treating said layered structure under conditions such that nanostructures form. In one embodiment, said treating comprises annealing. In one embodiment, said annealing comprises heating. In one embodiment, the method further comprises f) etching said layered structure under conditions such that the top coat and part of the block copolymer is removed revealing said nanostructures. In one embodiment, said etching comprises oxygen etching. In one embodiment, said a surface energy neutralization layer polymer comprises maleic anhydride. In one embodiment, said surface energy neutralization layer polymer is dissolved in an aqueous weak base prior to step b) to create a casting solvent. In one embodiment, said base is aqueous ammonium hydroxide and wherein the maleic anhydride opens and forms the ammonium salt of the corresponding maleic acid. In one embodiment, said surface energy neutralization layer polymer is composed of various polymer components one of which is maleic anhydride. In one embodiment, said surface energy neutralization layer polymer components must be soluble in aqeous base. In one embodiment, the proportions of the components can be varied such that the surface energy of the surface energy neutralization layer polymer layer is varied. In one embodiment, the surface energy switches as the surface energy neutralization layer polymer is baked. In one embodiment, said top coat composition is composed of various polymer components one of which is maleic anhydride. In one embodiment, said top coat components must be soluble in aqeous base. In one embodiment, the proportions of the components can be varied such that the surface energy of the top coat layer is varied. In one embodiment, the surface energy switches as the top coat is baked. In one embodiment, said surface is on a silicon wafer. In one embodiment, the invention relates to the nanostructures made according to the process above. In one embodiment, said surface is treated under conditions such that said surface energy neutralization layer polymer is cross-linked to said surface comprises: i) dissolving said surface energy neutralization layer polymer in a solvent; ii) spin coating the surface energy neutralization layer upon the surface; iii) cross-linking by exposure to 250° C. for 5 minutes; and iv) subsequently washing with solvent. In one embodiment, said solvent is toluene. In one embodiment, said nanostructures comprise cylindrical structures, said cylindrical structures being substantially vertically aligned with respect to the plane of the surface. In one embodiment, said a surface energy neutralization layer polymer comprises maleic anhydride. In one embodiment, said surface energy neutralization layer polymer is dissolved in an aqueous weak base prior to step b) to create a casting solvent. In one embodiment, said base is aqueous ammonium hydroxide and wherein the maleic anhydride opens and forms the ammonium salt of the corresponding maleic acid.

In one embodiment, the invention relates to a method of applying a top coat to a block copolymer film to create a layered structure, comprising 1) a surface energy neutralization layer polymer is dissolved in toluene and spin coated, 2) the surface energy neutralization layer polymer is cross-linked at 250° C. for 5 min, 3) Washed with toluene 2 times, 4) Block copolymer is dissolved in toluene and spin coated, 5) Post apply bake at 110° C. for 1 minute, 6) Top coat polymer is dissolved in 30 wt % NH$_4$OH and spin-coated, 7) Post apply bake at 150° C. for 5 minutes; 8) Anneal the thin films at 170° C. for 18 hours. 9) Strip the top coat by spinning the wafer at 3000 rpm and applying 10 drops of 30 wt % NH$_4$OH aqueous solution dropwise. 10) Oxygen plasma etch the block copolymer with the following conditions: Pressure=20 mTorr, RF Power=10 W, ICP Power=50 W, O$_2$ flow rate=75 sccm, Argon flowrate=75 sccm, temperature=15° C., time=45 sec.

In one embodiment the invention relates to a method of producing a domain orientation controlled block copolymer film, comprising: a) providing a surface, a surface energy neutralization layer, block copolymer, and a random copolymer top coat comprising at least one maleic anhydride unit; b) treating said surface under conditions such that said surface energy neutralization layer is cross-linked on said surface; c) coating said surface with surface energy neutralization layer with block copolymer under such conditions so as to create a block copolymer film; d) aqueous spin coat deposition of said random copolymer top coat onto said coated block copolymer film surface; and e) treating said film under conditions such that nanostructures form. In one embodiment, said nanostructures comprise cylindrical structures, said cylindrical structures being substantially vertically aligned with respect to the plane of the surface. In one embodiment, said surface is on a silicon wafer. In one embodiment the invention is the film made according to the process described above. In one embodiment, said surface is treated under conditions such that said surface energy neutralization layer is cross-linked to said surface comprises: i) dissolving said surface energy neutralization layer polymer in a solvent; ii) spin coating the surface energy neutralization layer polymer upon the surface; iii) cross-linking by exposure to 250° C. for 5 minutes; and iv) subsequently washing with solvent. In one embodiment, said solvent is toluene. In one embodiment, said surface energy neutralization layer polymer is a surface energy neutralizing agent. In one embodiment, said surface energy neutralizing agent include but are not limited to cross-linkable random copolymers comprised of polystyrene and poly(methyl methacrylate) and substituted derivatives. While substrate surface energy neutralization layer layers can be crosslinked random copolymers, they could also be comprised of other moleculas like substituted silanes which actually react with the surface chemistry or in a special case there may be not substrate surface energy neutralization layer required In one embodiment, said surface energy neutralization layer polymer is selected from the group comprising:

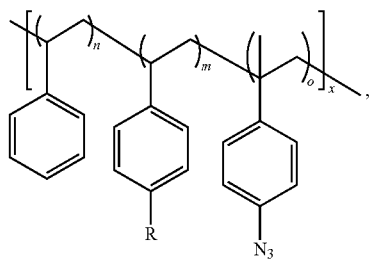

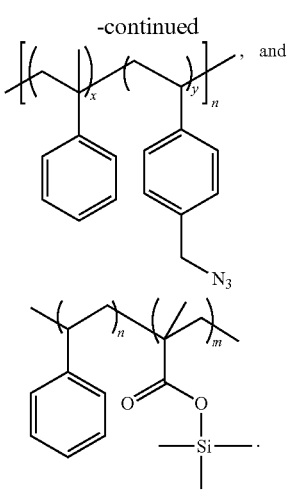

R =

H    OCH$_3$

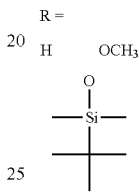

In one embodiment, said block copolymer is selected from the group comprising

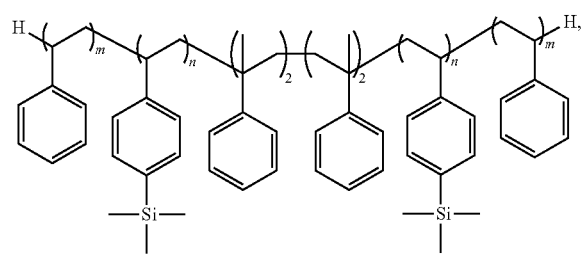

TMSS-Sty, and MTMSMA-Sty, but topcoats could be be generally useful for many block copolymers, these are non-limiting examples, poly(styrene-block-dimethyl siloxane) for example. In one embodiment, said conditions to create a block copolymer film comprise: i) dissolving said block copolymer in a solvent; ii) spin coating the block copolymer upon the surface cross-linked with surface energy neutralization layer polymer; and iii) subsequently baking for 110° C. for 1 minutes. In one embodiment, said solvent is toluene. In one embodiment, the method further comprises step e) comprises heating the thin film at 170° C. for 18 hours. In one embodiment, the invention comprises the etched nanostructures made according to the process of described above. In one embodiment, the invention comprises a layered structure comprising first, second and third layers on a surface, wherein said first layer comprises a crosslinked polymer, wherein said second layer comprises a block copolymer film, and wherein said third layer comprises a surface energy neutralization layer polymer has been deposited by spin coat treatment. In one embodiment, said surface comprises silicon. In one embodiment, the invention relates to the etched nanostructures made according to the process of described above. In one embodiment, said surface is on a silicon wafer. In one embodiment, said silicon wafer has a surface energy neutralization layer polymer. In one embodiment, said surface energy neutralization layer polymer has been deposited by spin coat treatment upon the surface of said silicon wafer. In one embodiment, the block copolymers form nanostructured materials that can be used as etch masks in lithographic patterning processes. In one embodiment, one of the blocks is polytrimethylsilylstyrene. In one embodiment, said first monomer is trimethyl-(2-methylene-but-3-enyl)silane. In one embodiment, said first monomer is a silicon-containing Methacrylate. In one embodiment, said first monomer is methacryloxymethyltrimethylsilane (MTMSMA). In one embodiment, a third monomer is provided and said block copolymer is a triblock copolymer. In one embodiment, the invention relates to the etched nanostructures made according to the process described above.

BRIEF DESCRIPTION OF THE DRAWINGS

For a more complete understanding of the features and advantages of the present invention, reference is now made to the detailed description of the invention along with the accompanying figures.

FIG. 5 shows the ring opening and closing of polymeric maleic anhydride and polymeric maleic acid.

FIG. 17 shows transmission electron microscope image of an etched thin film with the desired orientation. BCP Thickness 29.4 nm, film has been etched with O$_2$ plasma, and demonstrates perpendicular lamellar features.

FIG. 18 shows transmission electron microscope image of an etched thin film with the desired orientation. The film has been etched with O$_2$ plasma, and demonstrates perpendicular lamellar features.

FIG. 20 shows a diagram of an alternative annealing of the thin film to produce the desired block copoloymer orientation and subsequent oxygen plasma etching of the block copoloymer under the described conditions. 7) Anneal the thin films at 170° C. for 18 hours. 8) Strip the top coat by spinning the wafer at 3000 rpm and applying 10 drops of 30 wt % NH4OH aqueous solution dropwise. 9) Oxygen plasma etch the block copolymer with the following conditions: Pressure=20 mTorr, RF Power=10 W, ICP Power=50 W, O$_2$ flow rate=75 sccm, Argon flowrate=75 sccm, temperature=15° C., time=45 sec.

DEFINITIONS

Figure 1:
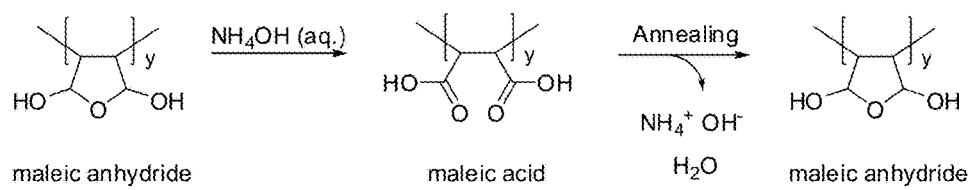
FIG. 1 shows the ring opening and closing of polymeric maleic anhydride and polymeric maleic acid.

To facilitate the understanding of this invention, a number of terms are defined below. Terms defined herein have meanings as commonly understood by a person of ordinary skill in the areas relevant to the present invention. Terms such as "a", "an" and "the" are not intended to refer to only a singular entity, but include the general class of which a specific example may be used for illustration. The terminology herein is used to describe specific embodiments of the invention, but their usage does not delimit the invention, except as outlined in the claims.

In addition, atoms making up the compounds of the present invention are intended to include all isotopic forms of such atoms. Isotopes, as used herein, include those atoms having the same atomic number but different mass numbers. By way of general example and without limitation, isotopes of hydrogen include tritium and deuterium, and isotopes of carbon include $^{13}C$ and $^{14}C$. Similarly, it is contemplated that one or more carbon atom(s) of a compound of the present invention may be replaced by a silicon atom(s). Furthermore, it is contemplated that one or more oxygen atom(s) of a compound of the present invention may be replaced by a sulfur or selenium atom(s).

As used herein "weak base" refers to a chemical base that does not ionize fully in an aqueous solution.

As used herein "surface energy neutralization layer" is the same as the "substrate energy neutralization layer."

An important factor in determining whether a block copolymer will self assemble into lamellae is the relative volume fraction of one of the blocks, the relative incompatibility of the monomer units, measured by the Flory-Huggins interaction parameter (Greek Symbol Chi $\chi$), and the degree of polymerization of the block copolymer. Preferably, the volume fraction of one of the blocks is 40-60, more preferably 50-50 and the degree of polymerization (N) and Flory-Huggins interaction parameter of the block copolymer is preferably greater than 10.5 and is more preferably greater than 25.

The block copolymer or blend thereof can be cross-linked by any convenient method. In one embodiment the block copolymer or blend thereof is deposited as a film or coating and then cross-linked using UV light or ionizing radiation. If necessary, free radical initiators or prorads may be added to the block copolymer or blend thereof in order to assist the cross-linking reaction. Preferably, however, the block copolymer or blend thereof comprises a cross-linking agent, especially when the block copolymer or blend thereof is used in a film-forming or coating composition. Preferably, the cross-linking agent and concentration of cross-linking agent are chosen such that the rate constant of the cross-linking reaction is relatively slow, thereby giving a relatively long pot life for the film-forming or coating composition. This is particularly important when the film-forming composition or coating composition is to be used as a printing ink or deposited using ink jet printing technology. Preferably, the rate constant of the cross-linking reaction is such that the speed of cross-linking is slower than the speed of self-assembly of the block copolymer or blend thereof.

The block copolymer or blend thereof can be cross-linked by any convenient method. In one embodiment the block copolymer or blend thereof is deposited as a film or coating and then cross-linked using UV light or ionizing radiation. If necessary, free radical initiators or prorads may be added to the block copolymer or blend thereof in order to assist the cross-linking reaction. Preferably, however, the block copolymer or blend thereof comprises a cross-linking agent, especially when the block copolymer or blend thereof is used in a film-forming or coating composition. Preferably, the cross-linking agent and concentration of cross-linking agent are chosen such that the rate constant of the cross-linking reaction is relatively slow, thereby giving a relatively long pot life for the film-forming or coating composition. This is particularly important when the film-forming composition or coating composition is to be used as a printing ink or deposited using ink jet printing technology. Preferably, the rate constant of the cross-linking reaction is such that the speed of cross-linking is slower than the speed of self-assembly of the block copolymer or blend thereof.

As used herein, Glass transition temperature is represented by the abbreviation $T_g$, Vitrification occurs when the glass transition temperature, $T_g$, rises to the isothermal temperature of cure, as described in Gillham, J. K. (1986) [10].

As used herein, silylating agents (also known as silanes or self-assembled monolayers) refer to organosilicon compounds with methoxy, ethoxy, or halide functionalities. Some non-limiting examples include methyldichlorosilane, methyldiethoxysilane, allyl(chloro)dimethylsilane, and (3-amniopropyl)triethoxysilane.

As used herein, brush polymers are a class of polymers that are adhered to a solid surface [11]. The polymer that is adhered to the solid substrate must be dense enough so that there is crowding among the polymers which then, forces the polymers to stretch away from the surface to avoid overlapping. [12]

In the field of electronic devices, Roll-to-roll processing, also known as web processing, reel-to-reel processing or R2R, is the process of creating electronic devices on a roll of flexible plastic or metal foil. In other fields predating this use, it can refer to any process of applying coatings, printing, or performing other processes starting with a roll of a flexible material and re-reeling after the process to create an output roll. A thin-film solar cell (TFSC), also called a thin-film photovoltaic cell (TFPV), is a solar cell that is made by depositing one or more thin layers (thin film) of photovoltaic material on a substrate substrate or surface. Possible roll-to-roll substrates include, but are not limited to metalized polyethylene terphthalate, metal film (steel), glass films (e.g. Corning Gorilla Glass), graphene coated films, polyethylene naphthalate (Dupont Teonex), and Kapton film, polymer films, metalized polymer films, glass or silicon, carbonized polymer films, glass or silicon. Possible polymer films include polyethylene terephthalate, kapton, mylar, etc.

As used herein, a block copolymer consists of two or more polymeric chains (blocks), which are chemically different and covalently attached to each other. Block copolymers are being suggested for many applications based primarily on their ability to form nanometer scale patterns. These self-assembled patterns are being considered as nanolithographic masks as well as templates for the further synthesis of inorganic or organic structures. Such applications are made possible by taking advantage of contrasts in chemical or physical properties that lead to differential etch rates or attractions to new materials. New applications in, for example, fuel cells, batteries, data storage and optoelectronic devices generally rely on the inherent properties of the blocks. All of these uses depend on the regular self-assembly of block copolymers over macroscopic distances.

Trimethyl-(2-methylene-but-3-enyl)silane is represented by the following structure:

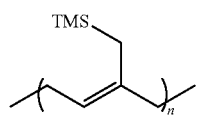

and abbreviated (TMSI) and whose polymeric version is

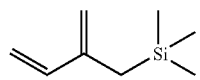

and is abbreviated P(TMSI).

Trimethyl(4-vinylphenyl)silane is another example of a styrene derivative and is represented by the following structure:

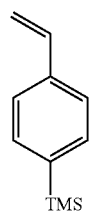

and abbreviated TMS-St and whose polymeric version is

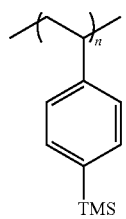

is and is abbreviated P(TMS-St).

Tert-butyldimethyl(4-vinylphenoxy)silane is another example of a styrene derivative and is represented by the following structure:

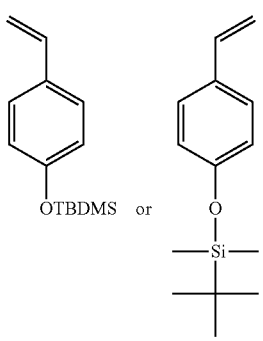 [SMILES: C=Cc1ccc(O[Si](C)(C)C(C)(C)C)cc1 ; "or" ; C=Cc1ccc(O[Si](C)(C)C(C)(C)C)cc1]

and abbreviated TBDMSO-St and whose polymeric version is

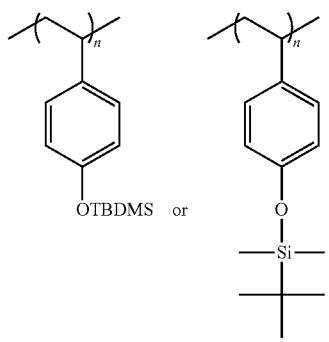

and is abbreviated P(TBDMSO-St).

Tert-butyldimethyl(oxiran-2-ylmethoxy)silane is an example of a silicon containing compound and is represented by the following structure:

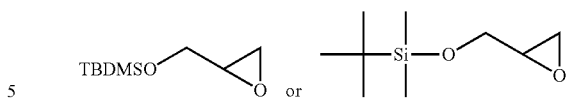

and is abbreviated TBDMSO-EO and whose polymeric version is

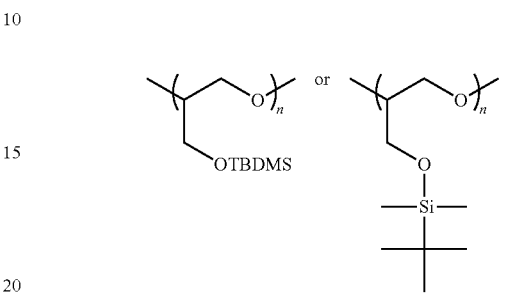

and is abbreviated P(TBDMSO-EO).

Methacryloxymethyltrimethylsilane is represented by the following structures:

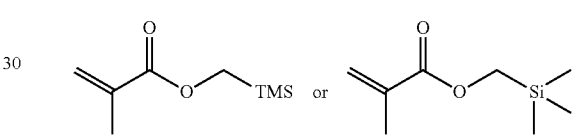

and abbreviated (MTMSMA) and whose polymeric version is

and is abbreviated P(MTMSMA).

In one embodiment, TMSS-Sty is represented by the following structure:

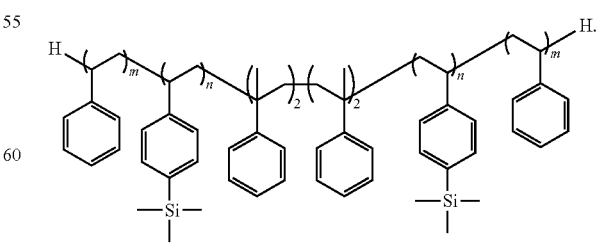

In one embodiment, the polymer MTMSMA-Sty is represented by the following structure:

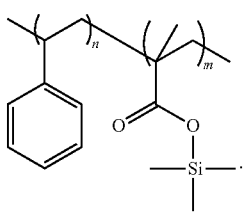

In one embodiment, the polymer X is represented by the following structure:

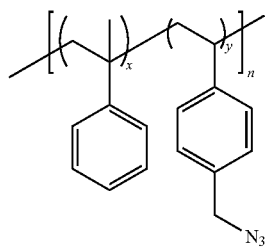

In one embodiment,

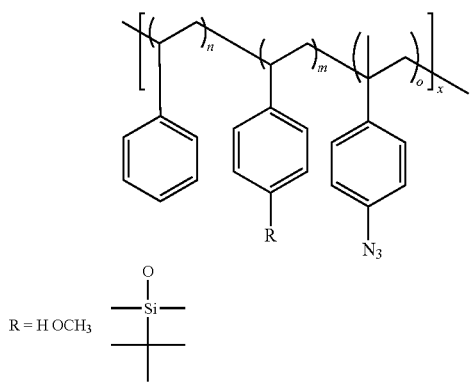

is an example of a 3 random copolymer surface energy neutralization layer.

The present invention also contemplates styrene "derivatives" where the basic styrene structure is modified, e.g. by adding substituents to the ring. Derivatives of any of the compounds shown in FIG. 2 or FIG. 3 can also be used. Derivatives can be, for example, hydroxy-derivatives or halo-derivatives. As used herein, "hydrogen" means —H; "hydroxy" means —OH; "oxo" means =O; "halo" means independently —F, —Cl, —Br or —I.

It is desired that the block copolymer be used to create "nanostructures" on a surface, or "physical features" with controlled orientation. These physical features have shapes and thicknesses. For example, various structures can be formed by components of a block copolymer, such as vertical lamellae, in-plane cylinders, and vertical cylinders, and may depend on film thickness, surface energy neutralization layer, and the chemical properties of the blocks. In a preferred embodiment, said cylindrical structures being substantially vertically aligned with respect to the plane of the first film. Orientation of structures in regions or domains at the nanometer level (i.e. "microdomains" or "nanodomains") may be controlled to be approximately uniform, and the spatial arrangement of these structures may also be controlled. For example, in one embodiment, domain spacing of the nanostructures is approximately 50 nm or less. The methods described herein can generate structures with the desired size, shape, orientation, and periodicity. Thereafter, in one embodiment, these structures may be etched or otherwise further treated.

DETAILED DESCRIPTION OF THE INVENTION

Figure 19:
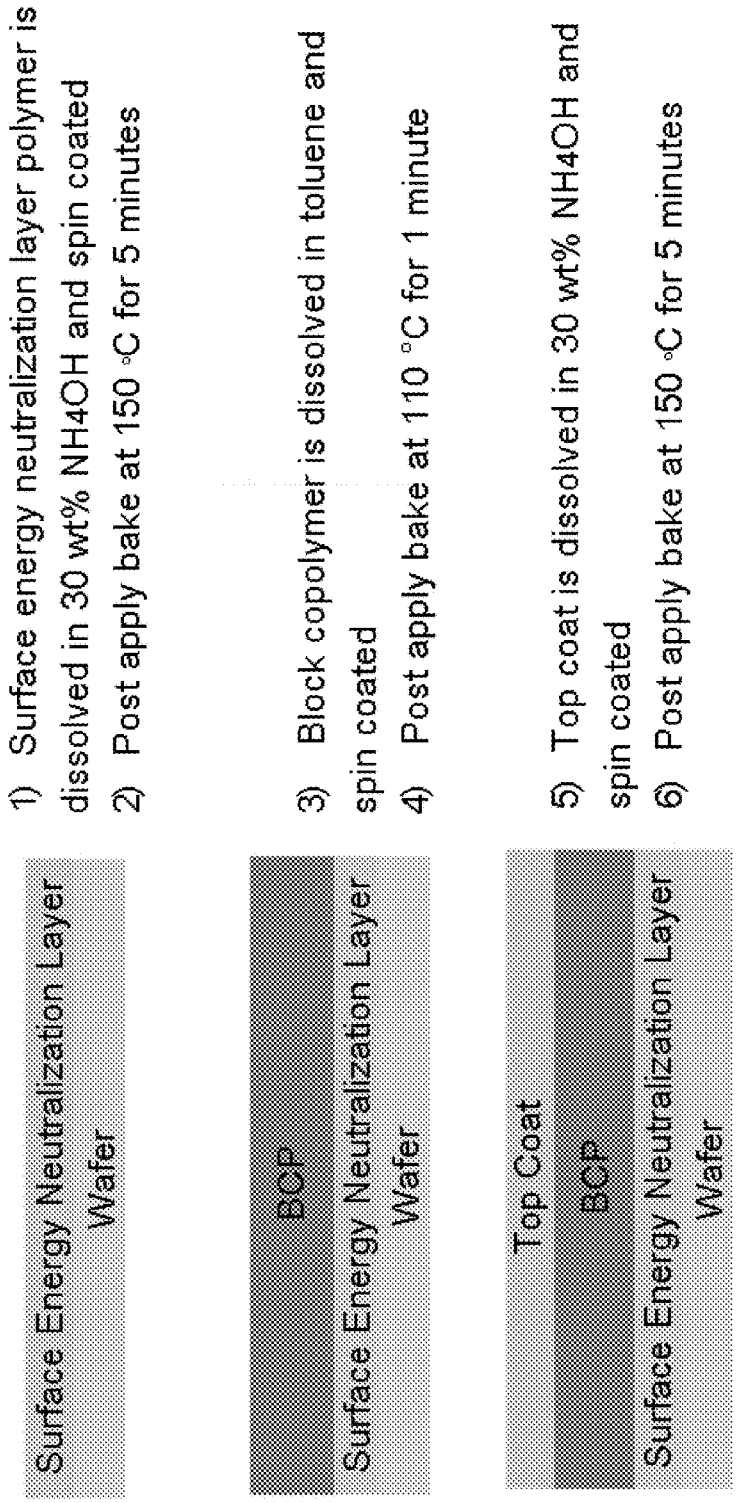
FIG. 19 shows a diagram of the construction process for the creation of the layers to be subsequently processed for orientation. 1) Top coat is dissolved in 30 wt % NH4OH and spin coated, 2) Post apply bake at 150° C. for 5 minutes, 3) Block copolymer is dissolved in toluene and spin coated, 4) Post apply bake at 110° C. for 1 minute, 5) Top coat polymer is dissolved in 30 wt % NH$_4$OH and spin-coated, 6) Post apply bake at 150° C. for 5 minutes.

The present invention involves the use of copolymer top coats that can be spin coated onto block copolymer thin films and used to control the interfacial energy of the top coat-block copolymer interface or as shown in FIG. 19 & FIG. 20, can be used to control block copolymer substrate interfacial energy. The top coats are soluble in aqueous weak base and can change surface energy once they are deposited onto the block copolymer thin film. The use of self-assembled block copolymers to produce advanced lithographic patterns relies on their orientation control in thin films. Top coats potentially allow for the facile orientation control of block copolymers which would otherwise be quite challenging.

For nanomanufacturing applications such as microelectronics, solar cells, and membranes, thin films with cylindrical or lamellar domains aligned perpendicular to a substrate surface are most attractive [13, 14]. BC thin film behavior has been studied by many researchers [15-17], and a recent review [13] has highlighted the importance of film thickness and interfacial interactions in dictating the BC orientation. One method of inducing cylinder or lamellar domains to orient perpendicular to the substrate is by treating the substrate with a surface modification agent such that the surface has an interfacial energy between that of each block. This type of substrate surface has been termed "neutral" because the enthalpic penalty for each block to establish contact with the substrate is approximately equal [15]. If this condition is not appropriately met, the cylinders or lamellae will usually lie parallel to the substrate with the block that most prefers the surface wetting the substrate [18]. In one embodiment, any application which requires the use of interfacial energy control could potentially benefit from the use of a top coat which changes surface energy after application of the top coat or other layers that interact with the block-copolymers, hereafter referred to as a surface energy neutralization layer. In one embodiment, copolymer top coats provide a protective coating to serve as a surface modification agent, but also minimize the air-polymer interface.

Figure 6:
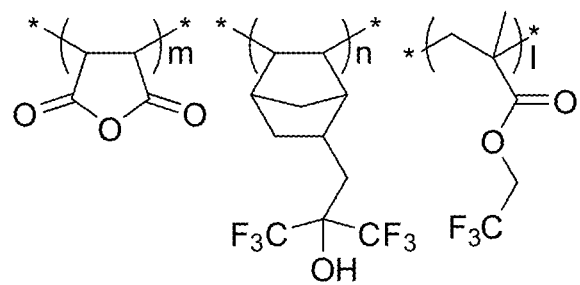
FIG. 6 shows an example of random copolymer top coat polymers.
Figure 7:
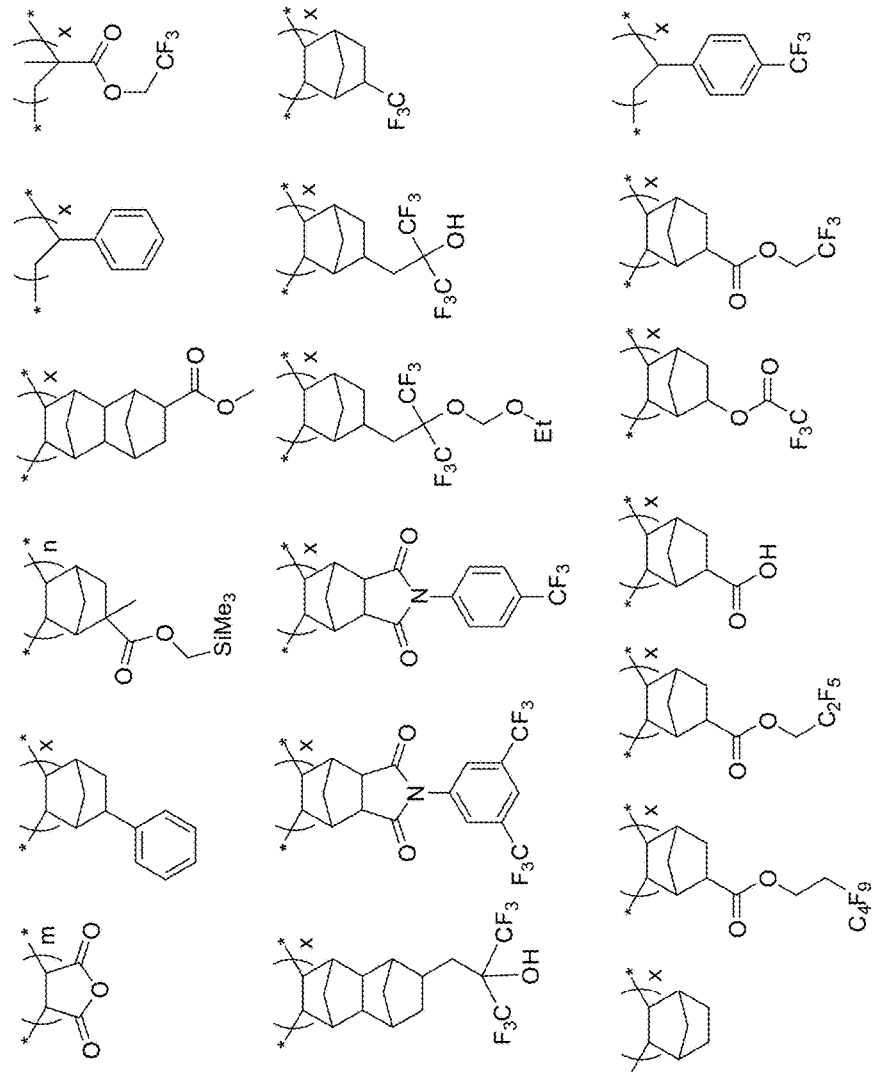
FIG. 7 shows some examples of polymer components that could be used in combination with other components along with maleic acid components for formulating top coat polymers layers or surface energy neutralization layer.
Figure 8:
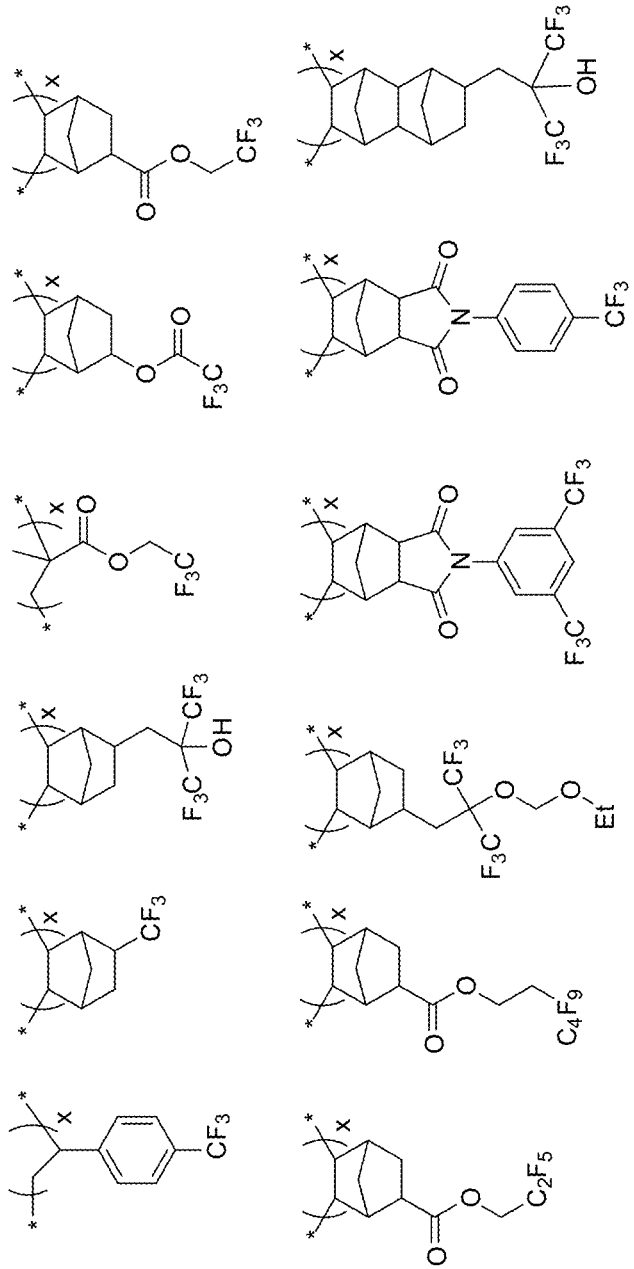
FIG. 8 shows fluorinated components that could be used in combination with other components along with maleic acid components for formulating top coat polymers layers or surface energy neutralization layer.
Figure 9:
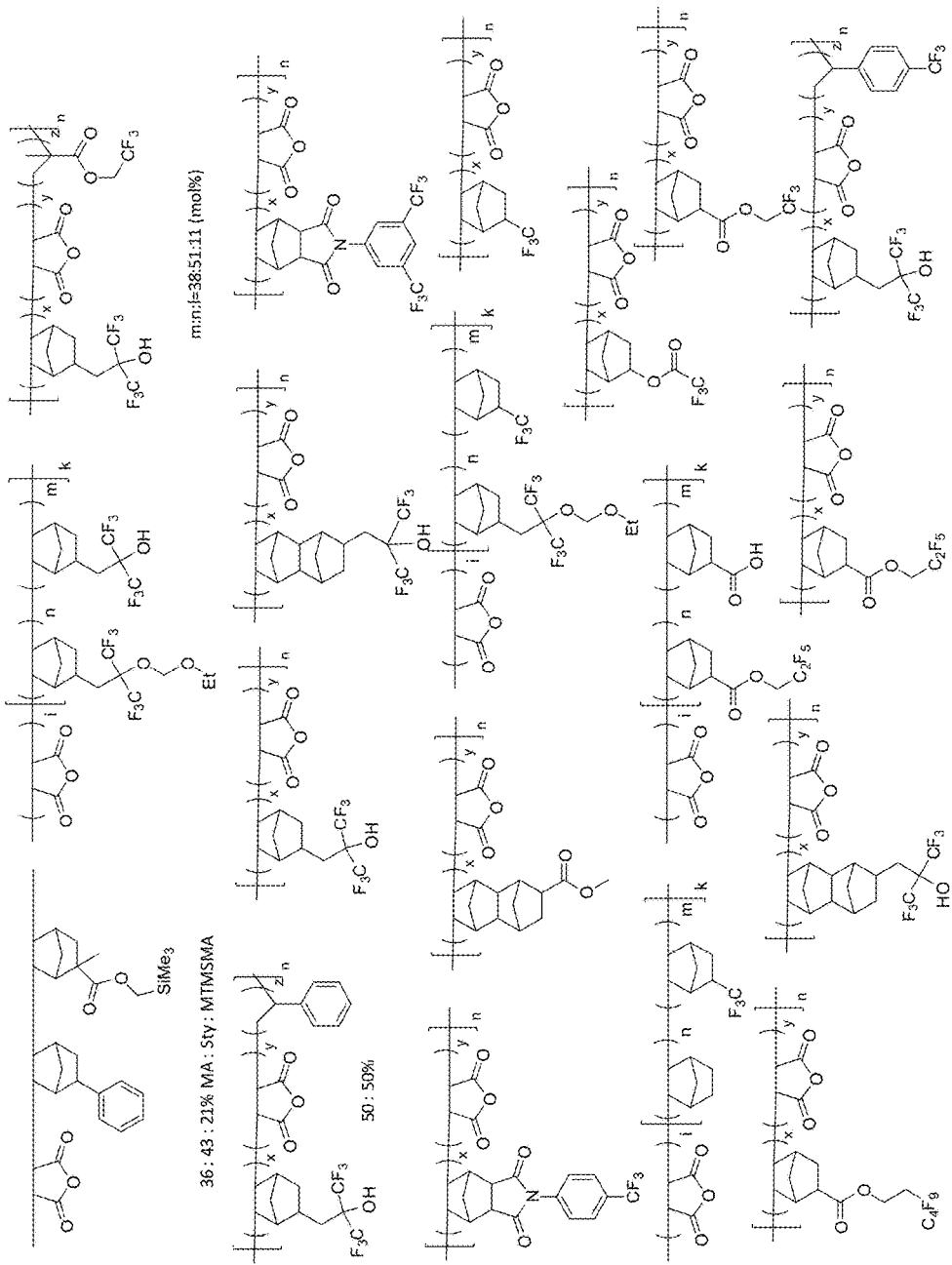
FIG. 9 shows a number of top coat polymer combinations already produced, component ratios are indicated in some cases.
Figure 10:
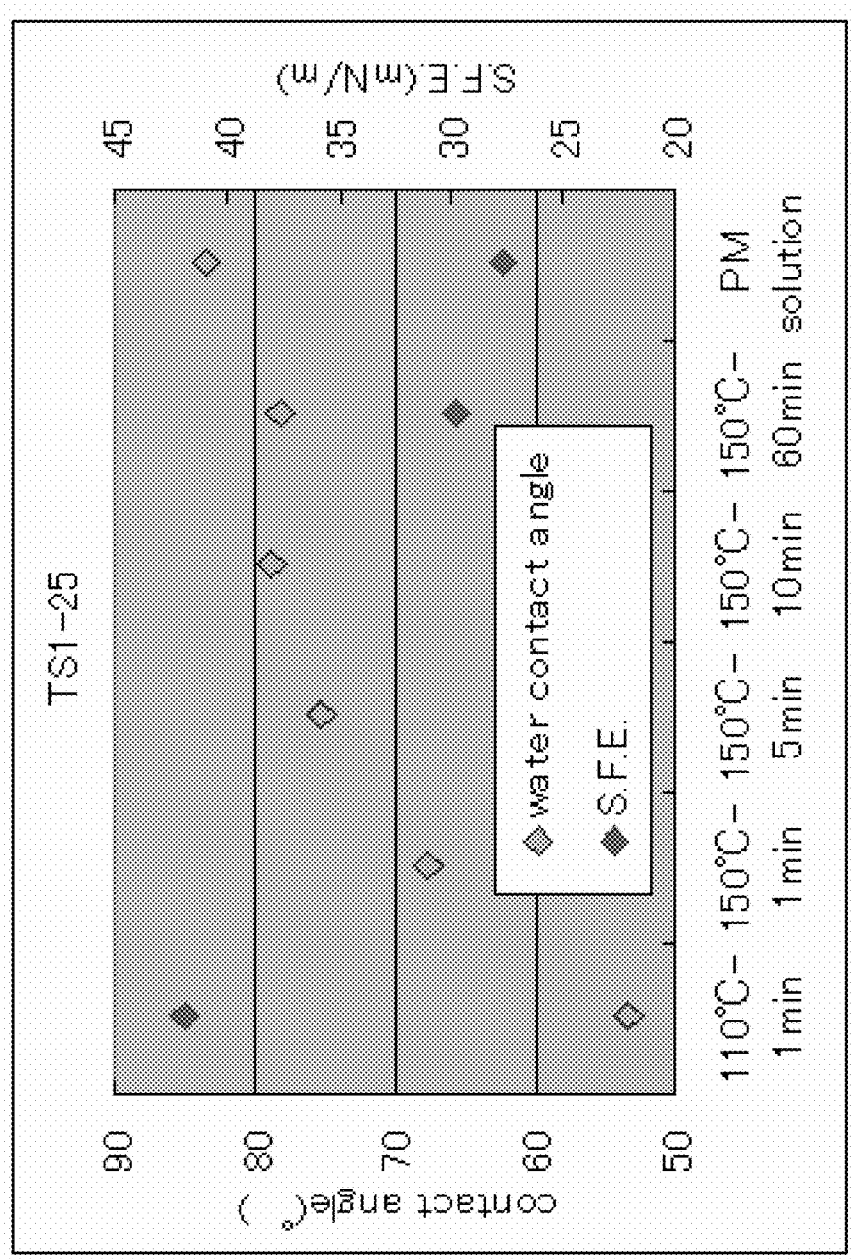
FIG. 10 shows that water contact angle and surface energy change as a function of annealing a thin film, because maleic anhydride ring opens and closes. Longer annealing times correspond to the ring closed foam (higher contact angle because it is less polar, dislikes water). Ring opened anionic form is aqueous weak base soluble, ring closes to lower the surface energy once it is applied to the thin film and annealed.
Figure 11:
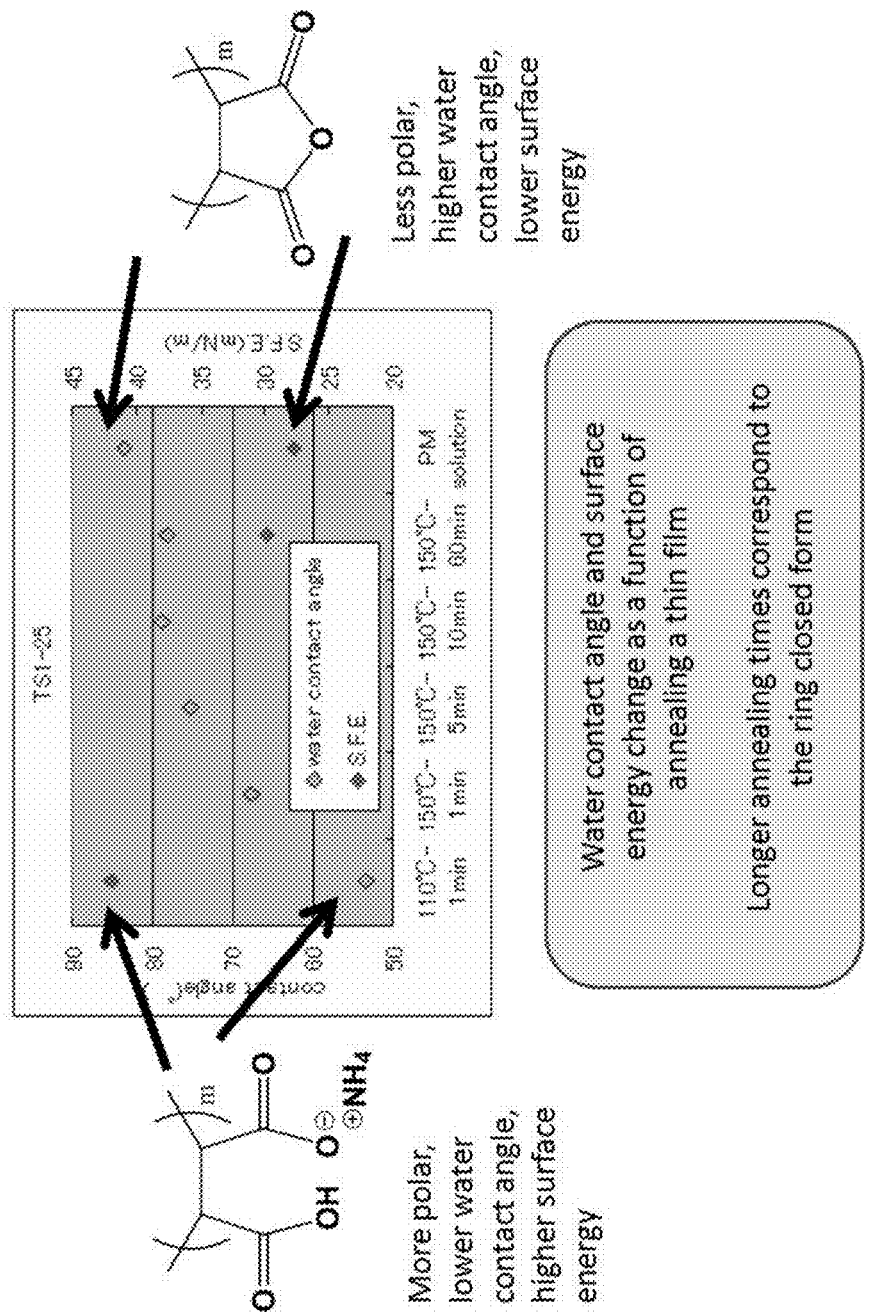
FIG. 11 further explains proof of ring opening and closing in the applied coat.
Figure 12:
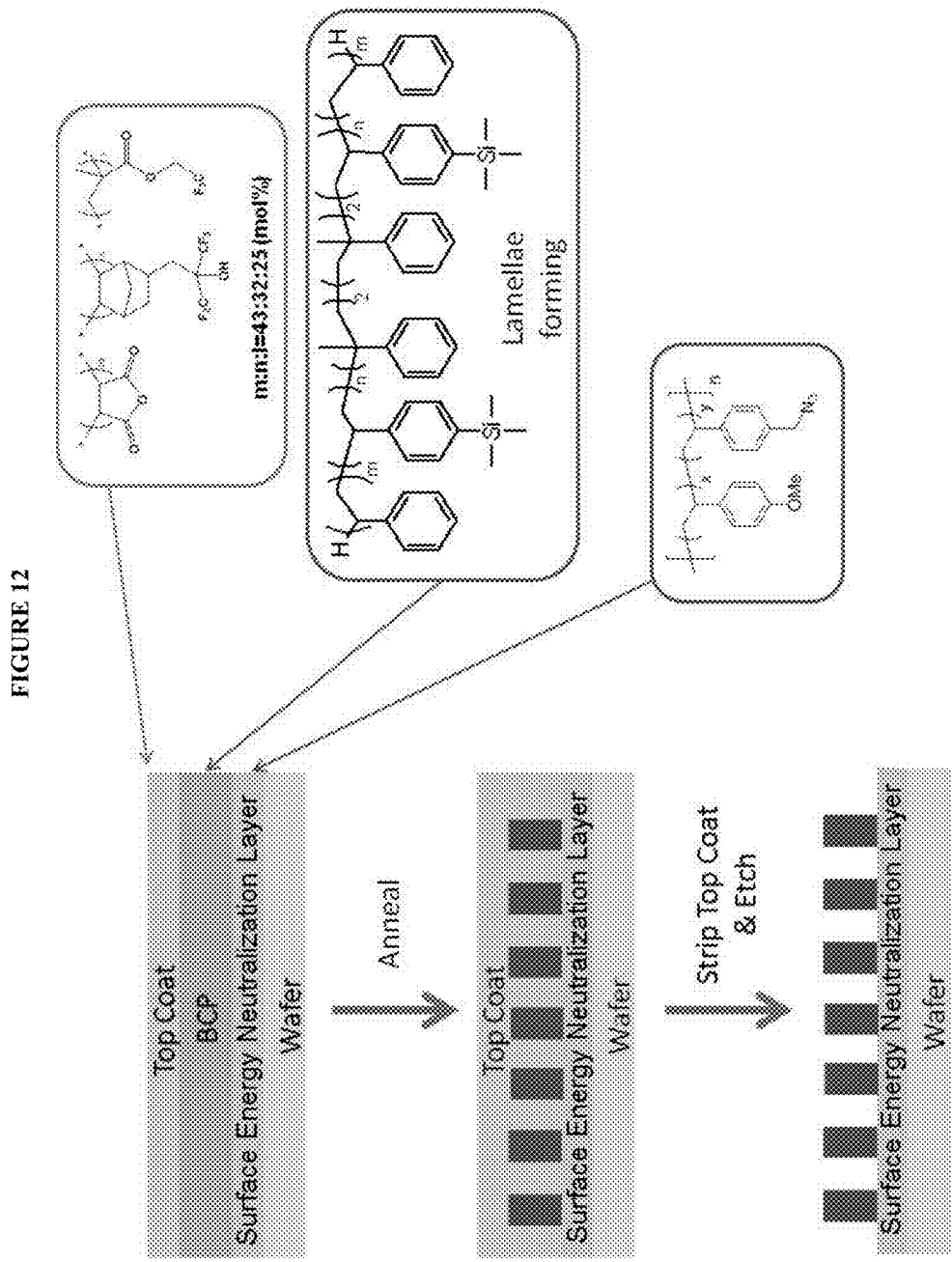
FIG. 12 shows the processing of the layered structures into etched thin copolymer films who's block copolymer domain orientation is determined by applying the top coat and annealing before oxygen etching.

The present invention involves the use of copolymer top coats that can be spin coated onto block copolymer thin films and used to control the interfacial energy of the top coat-block copolymer interface. The top coat polymers are soluble in aqueous weak base and can change surface energy once they are deposited onto the block copolymer thin film through thermally-activated ring closing to form a maleic anhydride ring, see FIG. 1. The copolymer top coat is composed of maleic anyhydride and other monomers which can include, but are not limited to functionalized methacrylates, acrylates, norbornenes, styrenes, butadienes, isoprenes, lactides, and ethylene oxides some examples of which are found in FIG. 7. In one embodiment, monomers that have lower surface energies than maleic anhydride, such as fluorinated monomers of the type aforementioned, can be used to decrease the overall surface energy of the top coat or surface energy neutralization layer as shown in FIG. 8. In one embodiment, the copolymer top coat is composed of maleic anyhydride and other monomers which can can be combined in various ratios to achieve a desired overall surface energy. In one embodiment, the copolymer top coat is composed of three components M-N-L, of which M must be maleic acid or a maleic acid derivative. In one embodiment, the variation of the amounts of the M-N-L components allows for fine tuning for the surface energy and its interaction with a block copolymer layer. Some examples of combinations for topcoats are shown in FIG. 9 In one embodiment, the copolymer top coat monomers can be soluble in aqueous weak base to enable spin coat application. In one embodiment, as shown in FIG. 6, the copolymer top coat can be combined in ratios, provided at least one of the monomers is a maleic acid or maleic anyhydride deriviative. In one embodiment, the copolymer top coat is removed by spinning the surface an applying a solution of an aqueous weak base, such as ammonium hydroxide ($NH_4OH$).

When dissolved in aqueous ammonium hydroxide (weak base), the maleic anhydride unit of the random copolymer top coat ring opens and forms the ammonium salt of the corresponding maleic acid, which is soluble in water and water-alcohol mixtures. The block-co-polymers of interest are not soluble in the casting solvent, which allows the top coat to be spin coated on top of the block copolymer thin film without damaging or modifying the block copolymer film. It is not intended that embodiments of the invention be limited to any block copolymer. However, the ammoniumsalt has a different surface energy than that of the anhydride. Upon annealing, the maleic acid reforms the anhydride (see FIG. 1), which results in the loss of water and ammonia and changes the surface energy of the top coat to be closer to that of the block copolymer domains. This is compared with present technologies that use water-soluble polymers to allow for top coats to be spin-coated on top of block copolymer thin films, but the top coats do not change surface energy after they are deposited. Hence, only very polar top coats can be spin coated. In one embodiment, the adjustable nature of the ratios of the top coat co-polymer monomers enables one to fine tune the surface energy of the deposited top which may enable improved orientation control of the block copolymers underneath. Ideally, the top coat would have a surface energy intermittent to that of all the blocks contained in block copolymer, such that the interaction energy between each block and the top coat is the same, creating no preference for a specific block to exclusively be in contact with the top coat. Thus, multiple blocks can interact with the top coat and produce perpendicular features.

The present invention additionally involves the use of copolymer layers that can be spin coated onto substrate surfaces to create a surface energy neutralization layer. In one embodiment, this surface energy neutralization layer would be found below a subsequent block copolymer thin film and used to control the interfacial energy of the surface energy neutralization layer-block copolymer interface (see FIG. 19 and FIG. 20). In one embodiment, the surface energy neutralization layer polymers are soluble in aqueous weak base and can change surface energy once they are deposited onto a surface, such as a silicon wafer (see FIG. 19), through thermally-activated ring closing to form a maleic anhydride ring, see FIG. 1. In one embodiment, the copolymer surface energy neutralization layer is composed of maleic anhydride and other monomers which can include, but are not limited to functionalized methacrylates, acrylates, norbornenes, styrenes, butadienes, isoprenes, lactides, and ethylene oxides some examples of which are found in FIG. 7. In one embodiment, monomers that have lower surface energies than maleic anhydride, such as fluorinated monomers of the type aforementioned, can be used to decrease the overall surface energy of the surface energy neutralization layer as shown in FIG. 8. In one embodiment, the copolymer top coat is composed of maleic anyhydride and other monomers which can can be combined in various ratios to achieve a desired overall surface energy. In one embodiment the copolymer surface energy neutralization layer is composed of three components M-N-L, of which M must be maleic acid or a maleic acid derivative. In one embodiment, the variation of the amounts of the M-N-L components allows for fine tuning for the surface energy and its interaction with a block copolymer layer. Some examples of combinations for surface energy neutralization layer are shown in FIG. 9 In one embodiment, the copolymer surface energy neutralization layer monomers can be soluble in aqueous weak base to enable spin coat application. In one embodiment, as shown in FIG. 6, the copolymer surface energy neutralization layer can be combined in ratios, provided at least one of the monomers is a maleic acid or maleic anyhydride deriviative. In one embodiment, both the top coat and the surface energy neutralization layer are both polymers that contain a maleic acid or maleic anyhydride deriviative. In one embodiment, both the top coat and the surface energy neutralization layer are both polymers that contain a maleic acid or maleic anyhydride deriviative, but have different mixtures of M-N-L components.

The present invention solves a pressing problem in the field. The perpendicular orientation of block copolymer domains is required for the application of block copolymers to next-generation lithography. Proper control of the interfacial energy of both the top and bottom block copolymer interfaces can result in block copolymer orientation control, with block copolymer domains oriented perpendicular to the substrate. The control of the top interfacial energy is accomplished using a copolymer top coat described herein. The challenge is to apply a top coat with a surface energy intermediate between that of the block copolymer domains. This is very difficult to do by spin coating as any solvent that will dissolve such a polymer will interact strongly with the block co-polymer. This invention allows casting of a very polar polymer from polar solvents that do not interact strongly with the block copolymer and once coated, readily modified to produce a top coat with lower surface energy.

The present invention provides advantages over current technologies. To produce the desired perpendicular orientation of block copolymer domains in thin films, the bottom and top interfaces generally must have an interfacial energy intermediate to the surface energy of the two block copolymer domains. Current technologies have started to discuss the use of water soluble polymers as top coats, because they can be spin coated onto hydrophobic block copolymers without destroying the block copolymer thin film. However, the main problem with water soluble polymers is that they are polar, which inherently means they have high surface energies and are thus likely to have a surface energy which is too high and does not fall in the range required to produce perpendicular block copolymer features. The present invention overcomes these problems by having a reversible ring-opening and ring-close maleic anhydride component in the top coat random copolymer. In the ring-opened form the polymer is soluble in aqueous weak base, which allows the top coat to be spin coated onto the block copolymer (see FIG. 1). The ring-closed maleic anhydride reforms during a post-apply bake, which reduces the polarity of the top coat significantly and brings the surface energy of the top coat closer to that of the block copolymer domains, promoting block copolymer orientation control. Previous developments in this area are described in a Japanese Patent Application JP 2010-115832A entitled "Method for Promoting Self-Formation of Block Copolymer and Method for Forming Self-Formation Pattern of Block Copolymer Using the Method for Promoting Self-Formation" [19], herein incorporated by reference and United States Application Endou, M. and Sasago, M. "Method of Accelerating Self-Assembly of Block Copolymer and Method of Forming Self-Assembled Pattern of Block Copolymer Using the Accelerating Method," United States Patent Application 20110186544 application Ser. No. 13/085,954, filed Apr. 13, 2011, (Published Aug. 4, 2011) [20], herein incorporated by reference.

It is desired that the block copolymer be used to create "nanostructures" on a surface, or "physical features" with controlled orientation. These physical features have shapes and thicknesses. For example, various structures can be formed by components of a block copolymer, such as vertical lamellae, in-plane cylinders, and vertical cylinders, and may depend on film thickness, surface energy neutralization layer, and the chemical properties of the blocks. In a preferred embodiment, said cylindrical structures being substantially vertically aligned with respect to the plane of the first film. Orientation of structures in regions or domains at the nanometer level (i.e. "microdomains" or "nanodomains") may be controlled to be approximately uniform, and the spatial arrangement of these structures may also be controlled. For example, in one embodiment, domain spacing of the nanostructures is approximately 50 nm or less. In a preferred embodiment, said cylindrical structures are controlled by the deposition of a polymer topcoat and aligned in an annealing process. The methods described herein can generate structures with the desired size, shape, orientation, and periodicity. Thereafter, in one embodiment, these structures may be etched or otherwise further treated.

Figure 2:
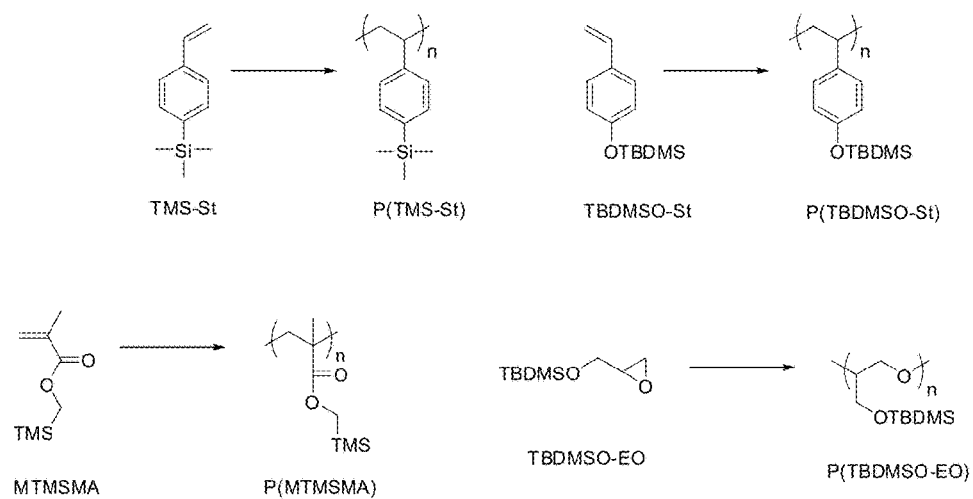
FIG. 2 shows non-limiting structures of illustrative silicon-containing monomers and polymers.
Figure 3:
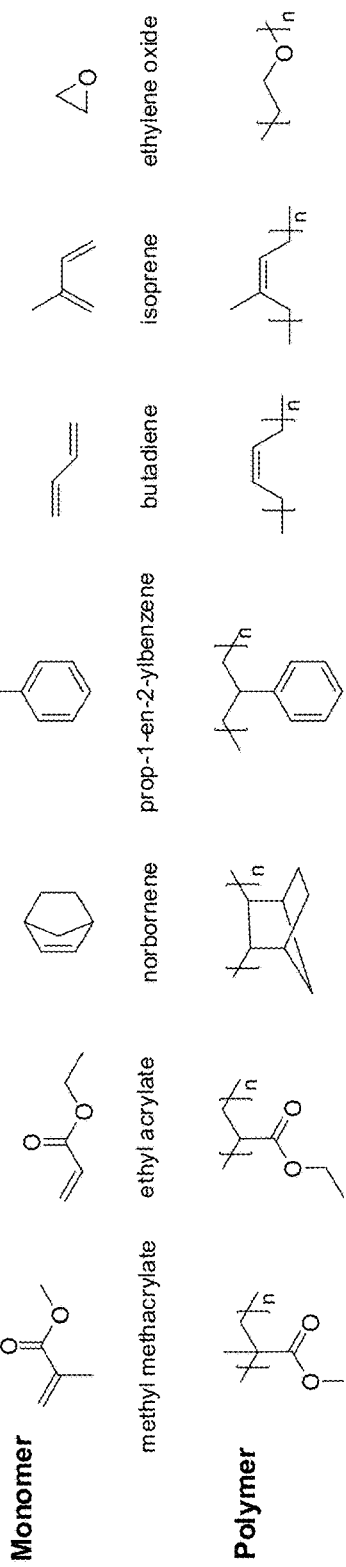
FIG. 3 shows some examples of monomers and polymers.
Figure 4:
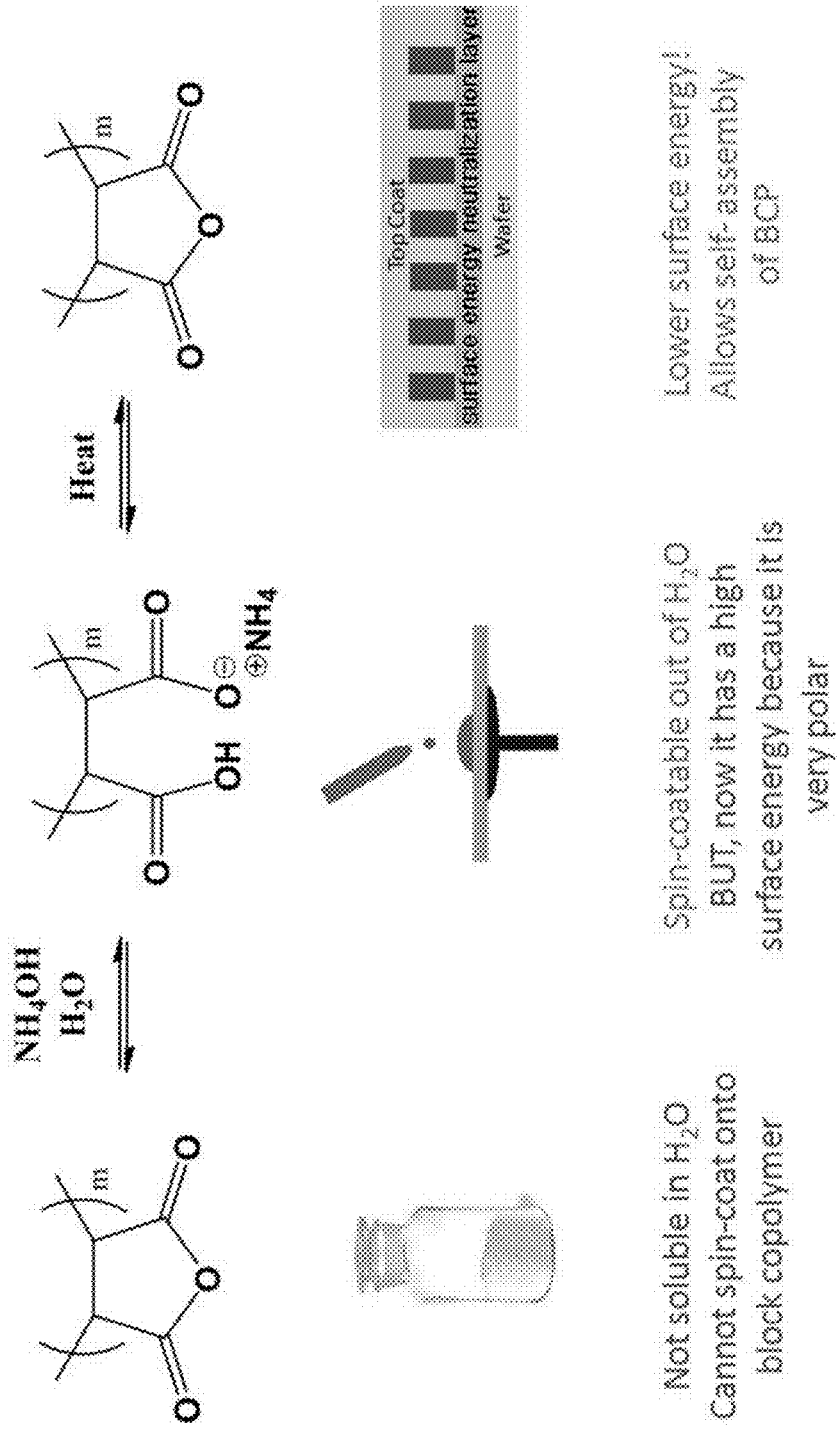
FIG. 4 shows the basic concept of the top coat spincoated containing maelic anhydride as a key component.

Block copolymers used in nanoscale lithographic patterning typically self-assemble to produce structures with characteristic sizes from 10-100 nm. In one embodiment, the invention includes the block together with a silicon containing synthetic block, the combination of which provides very high etch selectivity. In one embodiment, the invention is a potential solution to overcoming the feature-size limitations of conventional lithography techniques involves using self-assembled block copolymers to pattern nanoscale features. Block copolymer lithography circumvents physical and cost limitations present in conventional lithography techniques. Polymers with high segregation strength can form features much smaller than those achievable by photolithography and can do so using a less time-intensive process than electron beam lithography. This can be overcome by incorporating crosslinking functional groups within the polymer structure. This process is only useful when one of the domains of the block copolymer has high resistance against dry etching. This is fairly easy to achieve by incorporation of more than 10% by weight of the element silicon into one of the blocks. In one embodiment such Silicon-Containing Block Co-Polymers are described in a patent application PCT/US11/28867 entitled "Silicon-Containing Block Co-Polymers, Methods for Synthesis and Use" [21], herein incorporated by reference. Other elements that form refractory oxides can function in a similar fashion. It is not intended that the present invention be limited to a specific silicon-containing monomer or copolymer. Illustrative monomers are shown in FIG. 2.

In one embodiment, the top coat layer is composed of various polymer components. In one embodiment, maleic anhydride is a constant component. In one embodiment, the topcoat components must be soluble in aqeous base. In one embodiment, the proportions of the components can be varied such that the surface energy of the top coat layer is varied. In one embodiment, the surface energy switches as the top coat is baked. Although it is not necessary to understand the mechanism of an invention, it is believed that in one embodiment, the surface energy switching is the result of maleic anhydride ring closing. Examples of top coat components are shown in FIG. 9. In one embodiment, the invention comprises a layered structure comprising first, second and third layers on a surface, wherein said first layer comprises a crosslinked polymer, wherein said second layer comprises a block copolymer film, and wherein said third layer comprises maleic acid. In one embodiment, the layered structure, wherein said surface comprises silicon. In one embodiment, a layered structure comprising first, second and third layers on a surface, wherein said first layer comprises a maleic acid based substrate neutralization layer, wherein said second layer comprises a block copolymer film, and wherein said third layer comprises maleic acid. In one embodiment, the layered structure, wherein said surface comprises silicon.

In one embodiment, the method of applying spincoated copolymer surface energy neutralization layer to block-copolymers to provide a neutralizing interface to allow the formation of nanostructures could be used to allign liquid crystals. In one embodiment said aligned liquid crystals are useful for displays.

Thus, specific compositions and methods of Anhydride copolymer Top Coats for Orientation Control of Thin Film Block Copolymers have been disclosed. It should be apparent, however, to those skilled in the art that many more modifications besides those already described are possible without departing from the inventive concepts herein. The inventive subject matter, therefore, is not to be restricted except in the spirit of the disclosure. Moreover, in interpreting the disclosure, all terms should be interpreted in the broadest possible manner consistent with the context. In particular, the terms "comprises" and "comprising" should be interpreted as referring to elements, components, or steps in a non-exclusive manner, indicating that the referenced elements, components, or steps may be present, or utilized, or combined with other elements, components, or steps that are not expressly referenced.

All publications mentioned herein are incorporated herein by reference to disclose and describe the methods and/or materials in connection with which the publications are cited. The publications discussed herein are provided solely for their disclosure prior to the filing date of the present application. Nothing herein is to be construed as an admission that the present invention is not entitled to antedate such publication by virtue of prior invention. Further, the dates of publication provided may be different from the actual publication dates, which may need to be independently confirmed.

Example 1

Anhydride Copolymer Top Coats for Orientation Control of Thin Film Block Copolymers 1) Surface energy neutralization layer polymer is dissolved in toluene and spin coated, 2) Cross-linked at 250° C. for 5 min, 3) Washed with toluene 2 times, 4) Block copolymer is dissolved in toluene and spin coated, 5) Post apply bake at 110° C. for 1 minute, 6) Top coat polymer is dissolved in 30 wt % NH₄OH and spin-coated, 7) Post apply bake at 150° C. for 5 minutes; 8) Anneal the thin films at 170° C. for 18 hours. 9) Strip the top coat by spinning the wafer at 3000 rpm and applying 10 drops of 30 wt % NH$_4$OH aqueous solution dropwise. 10) Oxygen plasma etch the block copolymer with the following conditions: Pressure=20 mTorr, RF Power=10 W, ICP Power=50 W, O$_2$ flow rate=75 sccm, Argon flowrate=75 sccm, temperature=15° C., time=45 sec.

Figure 13:
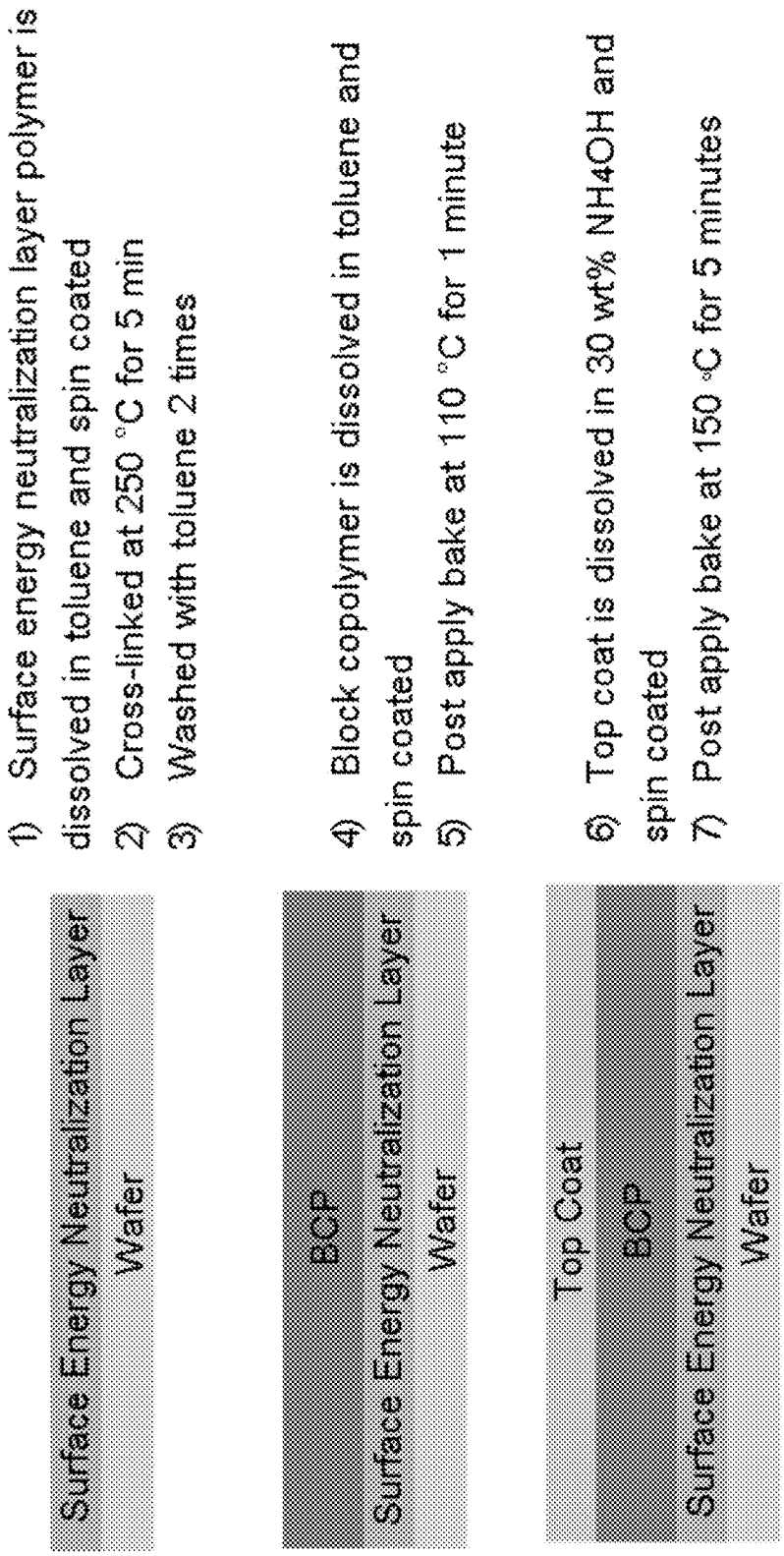
FIG. 13 shows a diagram of the construction process for the creation of the layers to be subsequently processed for orientation. 1) Surface energy neutralization layer polymer is dissolved in toluene and spin coated, 2) Cross-linked at 250° C. for 5 min, 3) Washed with toluene 2 times, 4) Block copolymer is dissolved in toluene and spin coated, 5) Post apply bake at 110° C. for 1 minute, 6) Top coat is dissolved in 30 wt % NH$_4$OH and spin-coated, and 7) Post apply bake at 150° C. for 5 minutes.
Figure 14:
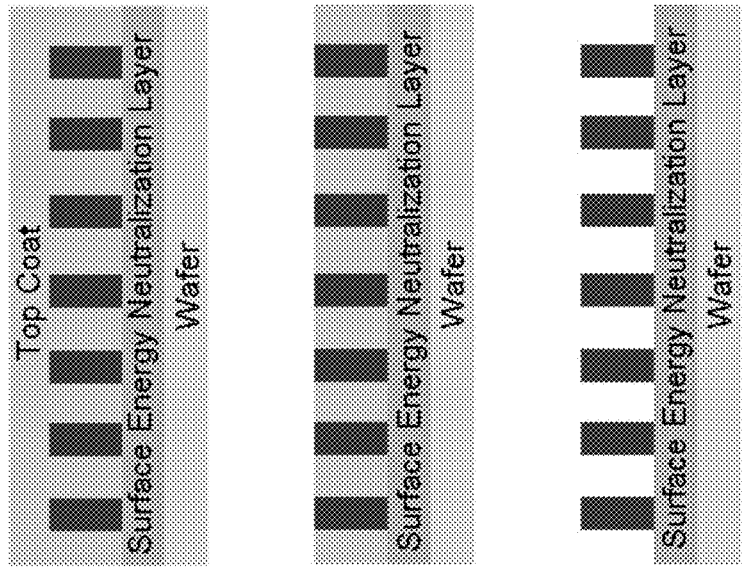
FIG. 14 shows a diagram of the annealing of the thin film to produce the desired block copoloymer orientation and subsequent oxygen plasma etching of the block copoloymer under the described conditions. 8) Anneal the thin films at 170° C. for 18 hours. 9) Strip the top coat by spinning the wafer at 3000 rpm and applying 10 drops of 30 wt % NH$_4$OH aqueous solution dropwise. 10) Oxygen plasma etch the block copolymer with the following conditions: Pressure=20 mTorr, RF Power=10 W, ICP Power=50 W, O$_2$ flow rate=75 sccm, Argon flowrate=75 sccm, temperature=15° C., time=45 sec.
Figure 15:
FIG. 15 shows transmission electron microscope image of an etched thin film with the desired orientation. BCP Thickness before anneal: 65.6 nm, after stripping the top coat: 66.9 nm, film has been etched with O$_2$ plasma, and demonstrates perpendicular lamellar features.
Figure 16:
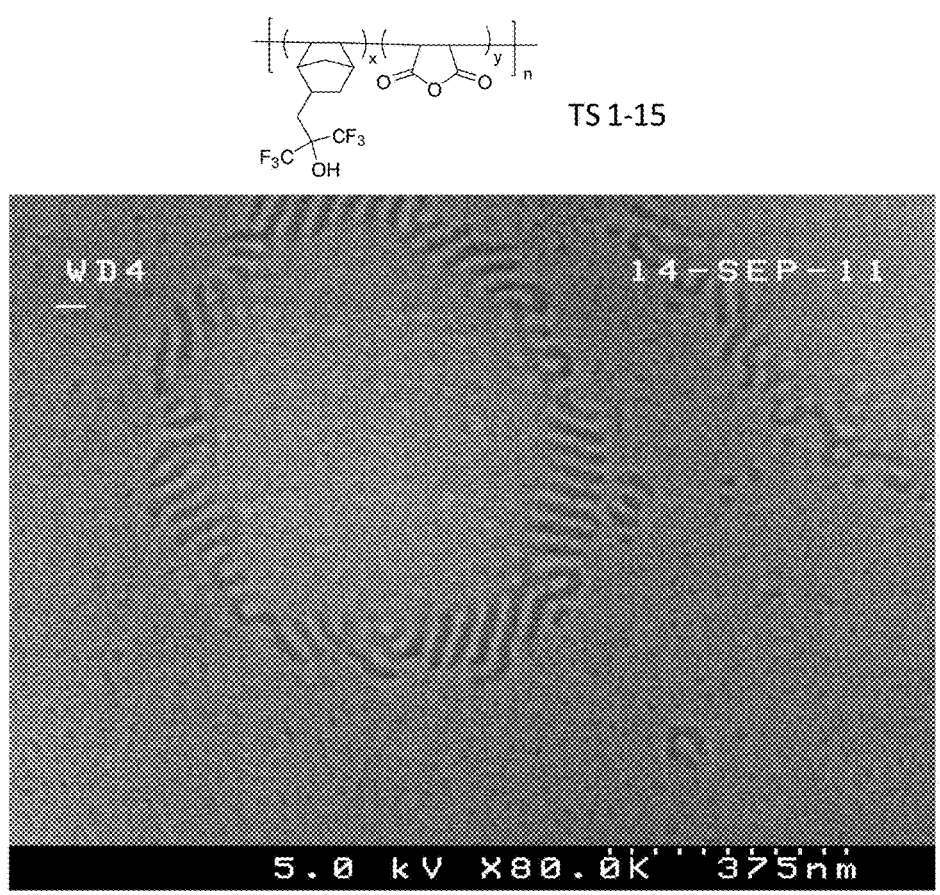
FIG. 16 shows transmission electron microscope image of an etched thin film with the desired orientation. BCP Thickness before anneal: 34 nm, film has been etched with O$_2$ plasma, and demonstrates perpendicular lamellar features.

See FIG. 13 and FIG. 14.

Example 2

Alternative Procedure Using Maleic Anhydride Containing Copolymer Top Coats for Orientation Control of Thin Film Block Copolymers 1) Top coat is dissolved in 30 wt % NH4OH and spin coated, 2) Post apply bake at 150° C. for 5 minutes for a substrate neutralization layer, 3) Block copolymer is dissolved in toluene and spin coated, 4) Post apply bake at 110° C. for 1 minute, 5) Top coat polymer is dissolved in 30 wt % NH$_4$OH and spin-coated, 6) Post apply bake at 150° C. for 5 minutes; 7) Anneal the thin films at 170° C. for 18 hours. 8) Strip the top coat by spinning the wafer at 3000 rpm and applying 10 drops of 30 wt % NH$_4$OH aqueous solution dropwise. 9) Oxygen plasma etch the block copolymer with the following conditions: Pressure=20 mTorr, RF Power=10 W, ICP Power=50 W, O$_2$ flow rate=75 sccm, Argon flowrate=75 sccm, temperature=15° C., time=45 sec.

See FIG. 19 and FIG. 20.

REFERENCES

1. Ross, C. A. (2001) Patterned Magnetic Recording Media, *Annu. Rev. Mater. Res.* 31(1), 203-238.
2. Yang, X. et al. (2008) Toward 1 Tdot/in.² nanoimprint lithography for magnetic bit-patterned media: Opportunities and challenges *J. Vac. Sci. Technol.* 26(6), 2604-2610
3. Ruiz, R. et al. (2008) Density Multiplication and Improved Lithography by Directed Block Copolymer Assembly, *Science* 321(5891), 936-939.
4. Bates, F. S. and Fredrickson, G. H. (1990) Block Copolymer Thermodynamics: Theory and Experiment, *Annu. Rev. Phys. Chem.* 41, 525-557.
5. Li, M. and Ober, C. K. (2006) Block copolymer patterns and templates, *Mater. Today* 9(9), 30-39.
6. Colburn, M. et al. (2000) Step and flash imprint lithography for sub-100-nm patterning, *Proc. SPIE-Int. Soc. Opt. Eng.* 3997, 453-457.
7. Kim, H.-C. et al. (2001) A Route to Nanoscopic SiO$_2$ Posts via Block Copolymer Templates, *Adv. Mater.* 13(11), 795-797.
8. Nagarajan, S. et al. (2008) An Efficient Route to Mesoporous Silica Films with Perpendicular Nanochannels, *Adv. Mater.* 20(2), 246-251.
9. Lammertink, R. G. H. et al. (2000) Nanostructured Thin Films of Organic-Organometallic Block Copolymers: One-Step Lithography with Poly(ferrocenylsilanes) by Reactive Ion Etching, *Adv. Mater.* 12(2), 98-103.
10. Gillham, J. K. (1986) Formation and Properties of Thermosetting and High T$_g$ Polymeric Materials, *Polym. Eng. Sci.* 26(20), 1429-1433.
11. Milner, S. T. (1991) Polymer brushes, *Science* 251 (4996), 905+.
12. Zhao, B. and Brittain, W. J. (2000) Polymer brushes: surface-immobilized macromolecules, *Prog. Polym. Sci.* 25(5), 677-710.
13. Kim, H.-C., Park, S.-M., and Hinsberg, W. D. (2009) Block Copolymer Based Nanostructures: Materials, Processes, and Applications to Electronics, *Chemical Reviews* 110(1), 146-177.
14. Park, M. et al. (1997) Block Copolymer Lithography: Periodic Arrays of ~1011 Holes in 1 Square Centimeter, *Science* 276(5317), 1401-1404.
15. Han, E. et al. (2009) Perpendicular Orientation of Domains in Cylinder-Forming Block Copolymer Thick Films by Controlled Interfacial Interactions, *Macromolecules* 42(13), 4896-4901.
16. Ryu, D. Y. et al. (2007) Surface Modification with Cross-Linked Random Copolymers: Minimum Effective Thickness, *Macromolecules* 40(12), 4296-4300.
17. Walton, D. G. et al. (1994) A Free Energy Model for Confined Diblock Copolymers, *Macromolecules* 27(21), 6225-6228.
18. Bates, C. M. et al. (2011) Polymeric Cross-Linked Surface Treatments for Controlling Block Copolymer Orientation in Thin Films, *Langmuir* 27(5), 2000-2006.
19. Masataka, E. "Method for promoting self-formation of block copolymer and method for forming self-formation pattern of block copolymer using the method for promoting self-formation," Japanese Patent Application JP 2010-115832A Application JP 2008-289806, filed Nov. 12, 2008 (Published May 27, 2010).
20. Endou, M. and Sasago, M. "Method of Accelerating Self-Assembly of Block Copolymer and Method of Forming Self-Assembled Pattern of Block Copolymer Using the Accelerating Method," United States Patent Application 20110186544 application Ser. No. 13/085,954, filed Apr. 13, 2011. (Published Aug. 4, 2011).
21. Willson, C. G. et al. "Silicon-Containing Block Co-Polymers, Methods for Synthesis and Use," United States Patent Application PCT/US11/28867, filed Mar. 17, 2011.

The invention claimed is:

1. A layered structure comprising first, second and third layers on a surface, wherein said first layer comprises a crosslinked polymer, wherein said second layer comprises a block copolymer film, and wherein said third layer comprises a random copolymer comprising at least one maleic anhydride unit, wherein said second layer block copolymer are selected from the group consisting of poly(styrene-block-dimethyl siloxane), pTBDMSO-Sty, pMTMSMA, pTMSS-Sty, and pMTMSMA-Sty, wherein pTBDMSO-Sty is

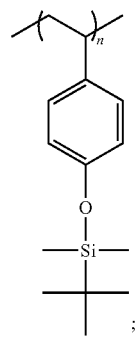

pMTMSMA is

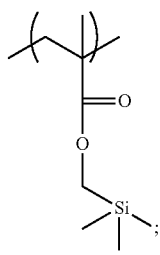

pTMSS-Sty is

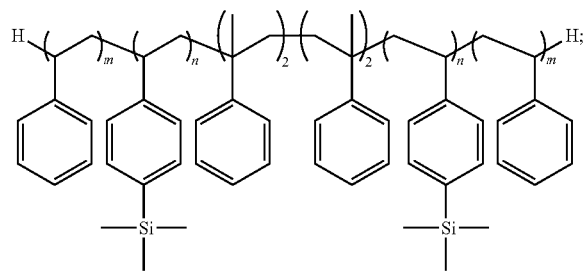

and pMTMSMA-Sty is

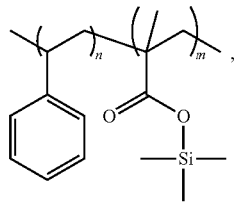

wherein said third layer comprises

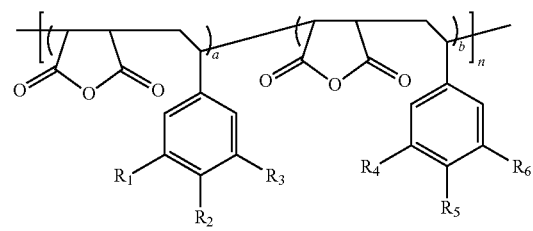

wherein $R_1$ is selected from the group consisting of H, F, CF$_3$, and C(CH$_3$)$_3$, $R_2$ is selected from the group consisting of H, Me, SiMe$_3$, CF$_3$, and C(CH$_3$)$_3$, $R_3$ is selected from the group consisting of H, CF$_3$, and C(CH$_3$)$_3$, $R_4$ is selected from the group consisting of H, F, CF$_3$, and C(CH$_3$)$_3$, $R_5$ is selected from the group consisting of H, Me, SiMe$_3$, CF$_3$, and C(CH$_3$)$_3$, $R_6$ is selected from the group consisting of H, CF$_3$, and C(CH$_3$)$_3$.

2. The layered structure of claim 1, wherein said surface comprises silicon.

3. The layered structure of claim 1, wherein said surface comprises a silicon wafer.

4. A layered structure comprising first, second and third layers on a surface, wherein said first layer comprises a crosslinked polymer, wherein said second layer comprises a block copolymer film, and wherein said third layer comprises a random copolymer comprising at least one maleic anhydride unit, wherein said second layer block copolymer are selected from the group consisting of poly(styrene-block-dimethyl siloxane), pTBDMSO-Sty, pMTMSMA, pTMSS-Sty, and pMTMSMA-Sty, wherein pTBDMSO-Sty is

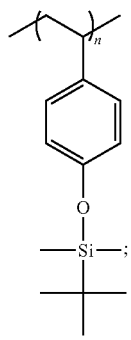

pMTMSMA is

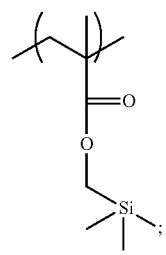

pTMSS-Sty is

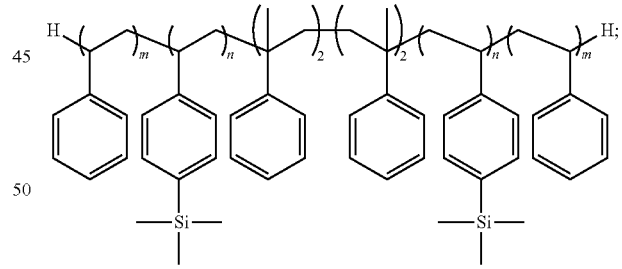

and pMTMSMA-Sty is

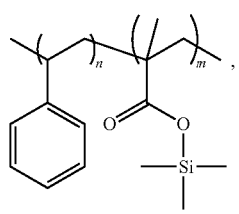

wherein said third layer comprises a polymer layer made from the polymer components including

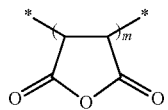

with at least one of the following additional polymer components selected from the group consisting of:

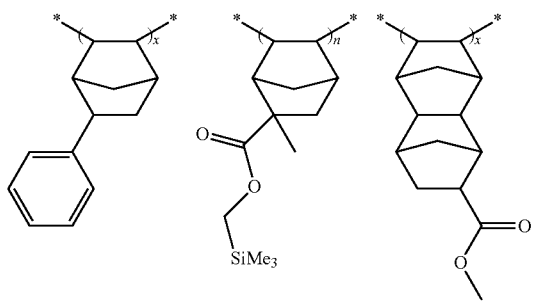

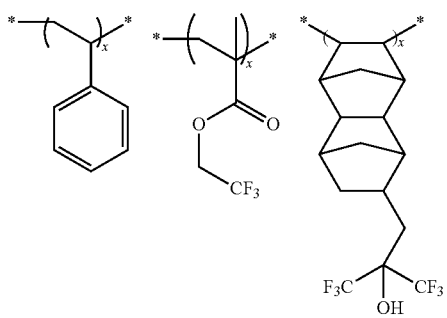

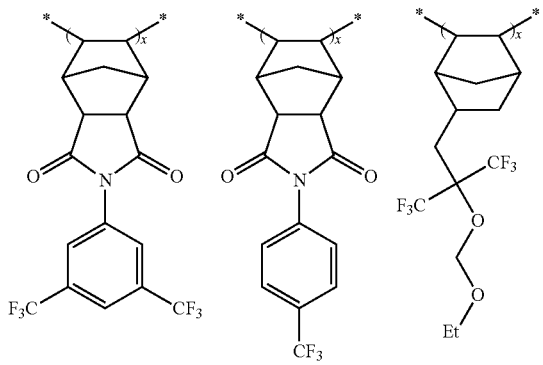

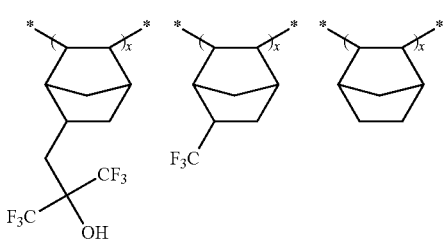

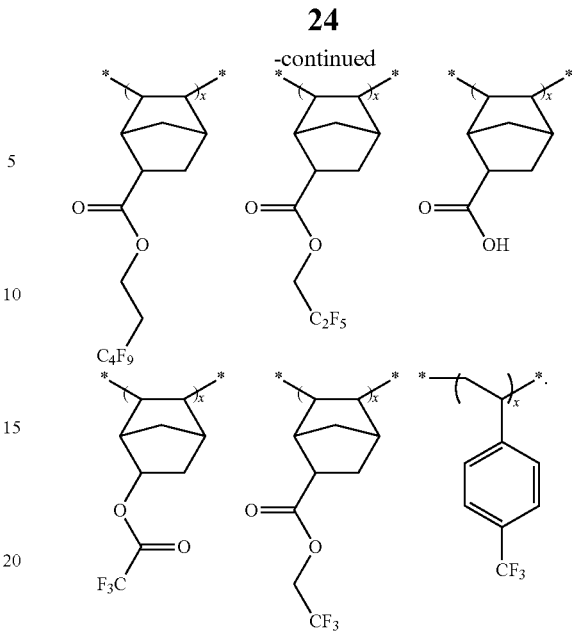

5. The layered structure of claim 4, wherein said surface comprises silicon.

6. The layered structure of claim 4, wherein said surface comprises a silicon wafer.

7. A layered structure comprising first, second and third layers on a surface, wherein said first layer comprises a maleic anhydride based substrate neutralization layer, wherein said second layer comprises a block copolymer film, and wherein said third layer comprises a maleic anhydride unit, wherein said second layer block copolymers are selected from the group consisting of poly(styrene-block-dimethyl siloxane), pTBDMSO-Sty, pMTMSMA, pTMSS-Sty, and pMTMSMA-Sty, wherein pTBDMSO-Sty is

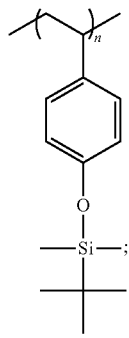

pMTMSMA is

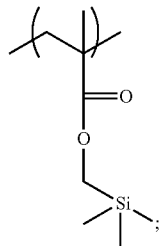

pTMSS-Sty is

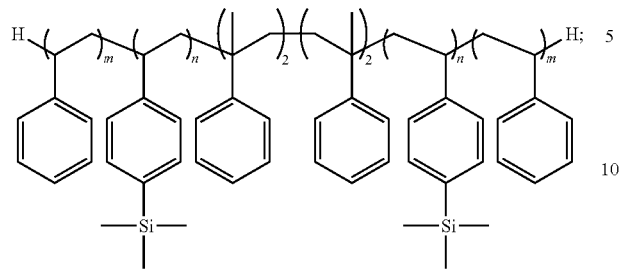

and pMTMSMA-Sty is

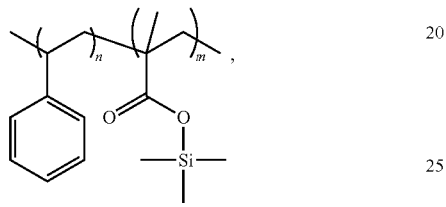

wherein said maleic anhydride based substrate neutralization layer comprises

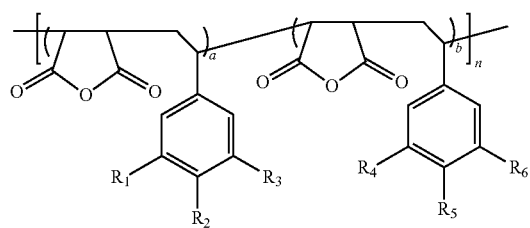

wherein $R_1$ is selected from the group consisting of H, F, $CF_3$, and $C(CH_3)_3$, $R_2$ is selected from the group consisting of H, Me, $SiMe_3$, $CF_3$, and $C(CH_3)_3$, $R_3$ is selected from the group consisting of H, $CF_3$, and $C(CH_3)_3$, $R_4$ is selected from the group consisting of H, F, $CF_3$, and $C(CH_3)_3$, $R_5$ is selected from the group consisting of H, Me, $SiMe_3$, $CF_3$, and $C(CH_3)_3$, $R_6$ is selected from the group consisting of H, $CF_3$, and $C(CH_3)_3$.

8. The layered structure of claim 7, wherein said surface comprises silicon.

9. A layered structure comprising first, second and third layers on a surface, wherein said first layer comprises a maleic anhydride based substrate neutralization layer, wherein said second layer comprises a block copolymer film, and wherein said third layer comprises a maleic anhydride unit, wherein said second layer block copolymers are selected from the group consisting of poly(styrene-block-dimethyl siloxane), pTBDMSO-Sty, pMTMSMA, pTMSS-Sty, and pMTMSMA-Sty, wherein pTBDMSO-Sty is

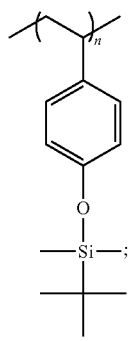

pMTMSMA is

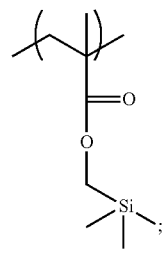

pTMSS-Sty is

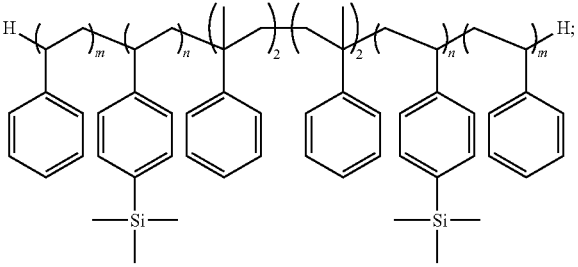

and pMTMSMA-Sty is

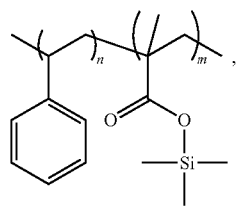

wherein said maleic anhydride based substrate neutralization layer comprises a polymer layer made from the polymer components including

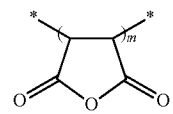

with at least one of the following additional polymer components selected from the group consisting of:
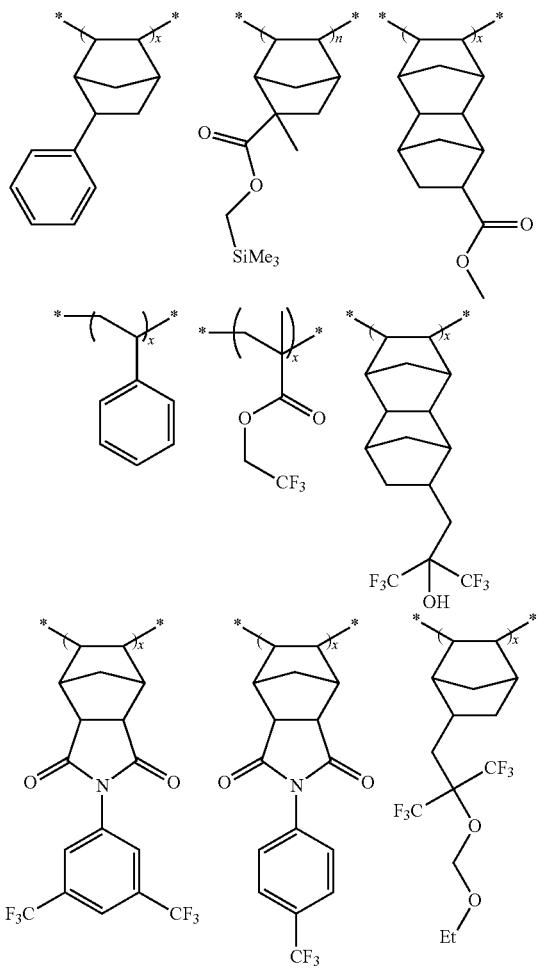
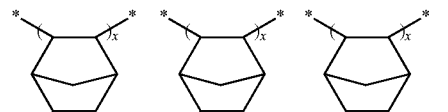
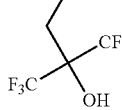 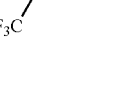 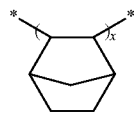
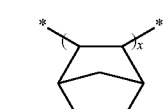 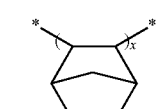 
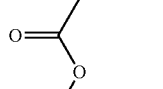 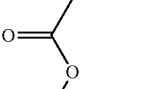 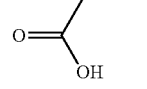
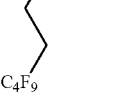 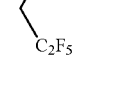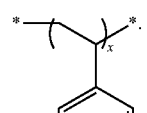
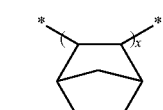 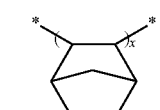
10. The layered structure of claim 9, wherein said surface comprises silicon.
* * * * *

UNITED STATES PATENT AND TRADEMARK OFFICE
CERTIFICATE OF CORRECTION

PATENT NO. : 10,139,724 B2
APPLICATION NO. : 14/839147
DATED : November 27, 2018
INVENTOR(S) : Willson et al.

Page 1 of 1

It is certified that error appears in the above-identified patent and that said Letters Patent is hereby corrected as shown below:

On the Title Page

At Item (72), delete the 3rd inventor, "Takehiro Sleshimo" and insert --TAKEHIRO SESHIMO--

Signed and Sealed this
Nineteenth Day of February, 2019

Andrei Iancu
*Director of the United States Patent and Trademark Office*